(12) United States Patent
Wang et al.

(10) Patent No.: US 12,205,971 B2
(45) Date of Patent: Jan. 21, 2025

(54) FINGERPRINT IDENTIFICATION MODULE AND DISPLAY DEVICE

(71) Applicants: Beijing BOE Sensor Technology Co., Ltd., Beijing (CN); BOE TECHNOLOGY GROUP CO., LTD., Beijing (CN)

(72) Inventors: Kuiyuan Wang, Beijing (CN); Cheng Li, Beijing (CN); Yue Geng, Beijing (CN); Chaoyang Qi, Beijing (CN); Yi Dai, Beijing (CN); Zefei Li, Beijing (CN); Xiaoguan Li, Beijing (CN); Yajie Feng, Beijing (CN); Yingzi Wang, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 572 days.

(21) Appl. No.: 17/610,203

(22) PCT Filed: Nov. 30, 2020

(86) PCT No.: PCT/CN2020/132663
§ 371 (c)(1),
(2) Date: Nov. 10, 2021

(87) PCT Pub. No.: WO2022/110109
PCT Pub. Date: Jun. 2, 2022

(65) Prior Publication Data
US 2023/0178578 A1 Jun. 8, 2023

(51) Int. Cl.
*H01L 27/146* (2006.01)
*G06V 10/147* (2022.01)
*G06V 40/13* (2022.01)

(52) U.S. Cl.
CPC ...... *H01L 27/14636* (2013.01); *G06V 10/147* (2022.01); *G06V 40/1318* (2022.01); *H01L 27/14616* (2013.01); *H01L 27/14649* (2013.01)

(58) Field of Classification Search
CPC ......... H01L 27/14636; H01L 27/14616; H01L 27/14649; H01L 27/14612;
(Continued)

(56) References Cited

U.S. PATENT DOCUMENTS 8,736,587 B2 * 5/2014 Yamazaki ............. H10K 59/60
345/204
10,121,051 B2 * 11/2018 Chen .................. G06V 40/1312
(Continued)

FOREIGN PATENT DOCUMENTS

CN 104978559 A 10/2015
CN 107633807 A 1/2018
(Continued)

*Primary Examiner* — Vu A Vu
(74) *Attorney, Agent, or Firm* — HOUTTEMAN LAW LLC

(57) ABSTRACT

The re is provided a fingerprint identification module, including a substrate having a fingerprint identification area and a peripheral area; a photoelectric sensing structure in the fingerprint identification area, and including pixel units; each pixel unit includes a thin film transistor having a gate electrode coupled to a corresponding gate line and a first electrode coupled to a corresponding signal sensing line; the fingerprint identification area includes a photosensitive region, the pixel unit in the photosensitive region further includes a photoelectric sensor including a third electrode, a photosensitive pattern and a fourth electrode which are sequentially stacked along a direction away from the substrate, and the third electrode is coupled to a second electrode of the thin film transistor in the same pixel unit as that where the photoelectric sensor is located; an area ratio of the
(Continued)

photoelectric sensor to the pixel unit corresponding thereto ranges from 40% to 90%.

19 Claims, 9 Drawing Sheets

(58) Field of Classification Search
CPC ............ H01L 27/14678; H01L 27/146; G06V 10/147; G06V 40/1318
USPC .......................................................... 257/72
See application file for complete search history.

(56) References Cited

U.S. PATENT DOCUMENTS

| | | | | |
|---|---|---|---|---|
| 10,380,404 | B2* | 8/2019 | Kim | G06V 40/1335 |
| 10,546,902 | B2* | 1/2020 | Lee | G06V 40/1306 |
| 10,727,285 | B2* | 7/2020 | Chung | H10K 39/00 |
| 11,288,484 | B2* | 3/2022 | You | H01L 25/16 |
| 11,631,271 | B2* | 4/2023 | Kim | G06F 3/044 |
| | | | | 345/174 |
| 11,727,874 | B2* | 8/2023 | Cha | G09G 3/2003 |
| | | | | 345/690 |
| 2014/0333328 | A1 | 11/2014 | Nelson et al. | |
| 2017/0243912 | A1 | 8/2017 | Kaneda | |
| 2018/0190190 | A1 | 7/2018 | Xi et al. | |
| 2019/0005295 | A1* | 1/2019 | Jia | H10K 39/32 |
| 2019/0042824 | A1 | 2/2019 | Zheng et al. | |
| 2019/0073961 | A1 | 3/2019 | Park et al. | |
| 2020/0042759 | A1 | 2/2020 | Kim et al. | |
| 2020/0097695 | A1 | 3/2020 | Yeke Yazdandoost et al. | |
| 2020/0334435 | A1 | 10/2020 | Hung et al. | |
| 2022/0036817 | A1 | 2/2022 | Xu et al. | |

FOREIGN PATENT DOCUMENTS

| | | |
|---|---|---|
| CN | 108288013 A | 7/2018 |
| CN | 109545813 A | 3/2019 |
| CN | 110795983 A | 2/2020 |
| CN | 110991396 A | 4/2020 |
| CN | 111353421 A | 6/2020 |
| CN | 211529183 U | 9/2020 |
| CN | 111834395 A | 10/2020 |
| CN | 111965881 A | 11/2020 |

* cited by examiner

FINGERPRINT IDENTIFICATION MODULE AND DISPLAY DEVICE

TECHNICAL FIELD

The present disclosure relates to the field of display technology, and in particular, relates to a fingerprint identification module and a display device.

BACKGROUND

In a process of optical fingerprint identification, the identification is generally performed by using a pixel array. Specifically, the pixel array includes a plurality of pixel units, for fingerprint identification, arranged in an array, and each pixel unit includes a thin film transistor and a photoelectric sensor, the thin film transistor can be configured to provide a driving signal for the photoelectric sensor to control the photoelectric sensor to operate, the photoelectric sensor is configured to receive detection light and output a corresponding electrical signal, and the electrical signal is transmitted to a signal sensing line through the thin film transistor to be processed by an external chip, so that valley and ridge information of corresponding positions is obtained.

SUMMARY

Embodiments of the present disclosure provide a fingerprint identification module, a method for manufacturing a fingerprint identification module, and a display device.

In a first aspect, an embodiment of the present disclosure provides a fingerprint identification module, including:
- a substrate including a fingerprint identification area and a peripheral area located at a periphery of the fingerprint identification area;
- a photoelectric sensing structure located on the substrate and in the fingerprint identification area, the photoelectric sensing structure including a plurality of gate lines, a plurality of signal sensing lines and a plurality of pixel units defined by the plurality of gate lines and the plurality of signal sensing lines in a crossed manner; where each pixel unit includes a thin film transistor, a gate electrode of the thin film transistor is electrically coupled to one of the gate lines corresponding thereto, and a first electrode of the thin film transistor is electrically coupled to one of the signal sensing lines corresponding thereto;
- where the fingerprint identification area includes a photosensitive region, each pixel unit located in the photosensitive region further includes a photoelectric sensor including a third electrode, a photosensitive pattern and a fourth electrode which are sequentially stacked along a direction away from the substrate, and the third electrode of the photoelectric sensor is coupled to a second electrode of the thin film transistor located in the same pixel unit as that where the photoelectric sensor is located;
- an area ratio of the photoelectric sensor to the pixel unit where the photoelectric sensor is located ranges from 40% to 90%.

In some implementations, the thin film transistor has a channel region in an inverted L shape or an arc shape.

In some implementations, an orthographic projection of the photoelectric sensor on the substrate does not overlap with an orthographic projection of an active layer of the thin film transistor on the substrate.

In some implementations, the gate lines extend in a first direction, the signal sensing lines extend in a second direction, and the first direction is perpendicular to the second direction;

the thin film transistor includes the gate electrode, an active layer, the first electrode and the second electrode, a cross section of the first electrode parallel to a plane where the substrate is located is rectangular, the first electrode has a first side edge and a second side edge which are oppositely arranged in the first direction and a third side edge and a fourth side edge which are oppositely arranged in the second direction, the first electrode is electrically coupled to the signal sensing line nearest to the first side edge of the first electrode, and the gate electrode is electrically coupled to the gate line nearest to the third side edge of the first electrode;

the second electrode includes a first conductive part and a second conductive part, the first conductive part extends along the first direction and is arranged opposite to the second side edge of the first electrode, the second conductive part extends along the second direction and is arranged opposite to the fourth side edge of the first electrode, and the first conductive part is electrically coupled to the second conductive part.

In some implementations, the second electrode further includes a third conductive part, the first conductive part, the second conductive part and the third conductive part are arranged in a same layer, a direction along which the third conductive part extends is intersected with the first direction and the second direction, and two ends of the third conductive part are coupled to the first conductive part and the second conductive part respectively.

In some implementations, the fingerprint identification area further includes a dummy region located at a periphery of the photosensitive region and the pixel units in the dummy region are configured to output reference noise signals to the signal sensing lines corresponding thereto.

In some implementations, a planarization layer and a passivation layer are sequentially disposed on a side of the photosensitive pattern away from the substrate, and the fourth electrode is located on a side of the passivation layer away from the substrate and is electrically coupled to the photosensitive pattern corresponding thereto through via holes in the planarization layer and the passivation layer;

each pixel unit located in the dummy region further includes a fifth electrode and a sixth electrode, the fifth electrode is electrically coupled to the second electrode of the thin film transistor in the dummy region, and the planarization layer and the passivation layer are arranged between the fifth electrode and the sixth electrode.

In some implementations, a first insulating layer is formed on a side of the thin film transistor away from the substrate, and the photoelectric sensor located in the photosensitive region is coupled to the second electrode of the thin film transistor through a via hole in the first insulating layer;

a planarization layer and a passivation layer are sequentially arranged on a side of the photosensitive pattern away from the substrate, and the fourth electrode is located on a side of the passivation layer away from the substrate, and is electrically coupled to the photosensitive pattern corresponding thereto through via holes in the planarization layer and the passivation layer;

each pixel unit located in the dummy region further includes a fifth electrode and a sixth electrode, the fifth electrode is electrically coupled to the second electrode of the thin film transistor in the dummy region, the fifth electrode and the third electrode are arranged in a same layer and are made of a same material, the sixth electrode and the fourth electrode are arranged in a same layer and are made of a same material, and the first insulating layer, the planarization layer and the passivation layer are arranged between the fifth electrode and the sixth electrode.

In some implementations, each pixel unit located in the dummy region further includes a sensor contrast structure, the sensor contrast structure includes a fifth electrode, a contrast pattern and a sixth electrode which are sequentially stacked along a direction away from the substrate, the fifth electrode is electrically coupled to the second electrode of the thin film transistor located in the dummy region, the fifth electrode and the third electrode are arranged in a same layer and are made of a same material, and the sixth electrode and the fourth electrode are arranged in a same layer and are made of a same material;

a material of the contrast pattern is a non-photoelectric material and a dielectric constant of the contrast pattern is approximately the same as that of the photosensitive pattern.

In some implementations, the fingerprint identification module further includes a first light blocking pattern located on a side of the photoelectric sensor away from the substrate, and orthographic projection of the first light blocking pattern on the substrate completely covers the dummy region and does not cover the photosensitive region.

In some implementations, the dummy region is located at a side of the photosensitive region.

In some implementations, the dummy region is located at opposite sides or intersecting sides of the photosensitive region.

In some implementations, the dummy region is located at four sides of the photosensitive region.

In some implementations, the thin film transistor included in the pixel unit located in the photosensitive region and the thin film transistor included in the pixel unit located in the dummy region are identical in structure, shape and size.

In some implementations, the fingerprint identification module further includes:

a collimating structure located on a side of the photoelectric sensing structure away from the substrate, and at least covers the photosensitive region;

the collimating structure includes an aperture layer, the aperture layer includes a plurality of light-transmitting holes arranged in an array.

In some implementations, the collimating structure further includes a medium light-transmitting layer, a lens layer and a flat light-transmitting layer which are arranged on a side of the aperture layer away from the substrate and sequentially stacked along a direction away from substrate;

the lens layer includes a plurality of convex lenses corresponding to the light-transmitting holes one to one, and an optical axis of each convex lens passes through the light-transmitting hole corresponding thereto.

In some implementations, the convex lenses are plano-convex lenses, a planar surface of each plano-convex lens faces the medium light-transmitting layer and is attached to a surface of the medium light-transmitting layer, and a convex surface of each plano-convex lens faces the flat light-transmitting layer and is attached to a surface of the flat light-transmitting layer.

In some implementations, each photoelectric sensor corresponds to multiple ones of the light-transmitting holes, and each light-transmitting hole corresponds to one of the photoelectric sensors.

In some implementations, the number of the light-transmitting holes corresponding to each photoelectric sensor is the same;

the number of the light-transmitting holes corresponding to each photoelectric sensor ranges from 4 to 100.

In some implementations, the fingerprint identification module further includes:

a invisible light filter layer located on a side of the photoelectric sensor away from the substrate, and configured to filter out invisible light in transmitted light.

In some implementations, the invisible light filter layer includes an infrared filter layer configured to filter out infrared light in the transmitted light.

In some implementations, the infrared filter layer includes an infrared absorbing layer having a function for absorbing infrared light or an infrared reflecting layer having a function for reflecting infrared light.

In some implementations, the invisible light filter layer is located between the collimating structure and the photoelectric sensor.

In some implementations, the invisible light filter layer is integrated within the collimating structure.

In some implementations, the invisible light filter layer is filled in the light-transmitting holes.

In some implementations, the collimating structure includes the aperture layer, a medium light-transmitting layer, a lens layer and a flat light-transmitting layer which are sequentially stacked along a direction away from the substrate, the lens layer includes a plurality of convex lenses corresponding to the light-transmitting holes one to one, and an optical axis of each convex lens passes through the light-transmitting hole corresponding thereto;

at least one of the medium light-transmitting layer and the flat light-transmitting layer is multiplexed as the invisible light filter layer.

In some implementations, the photoelectric sensing structure includes a gate electrode, a gate insulating layer, an active layer, a first conductive electrode layer, a first insulating layer, a photosensitive pattern, a planarization layer, a passivation layer and a second conductive electrode layer which are sequentially stacked along a direction away from the substrate, and the first light blocking pattern is located on a side of the second conductive electrode layer away from the substrate;

the first conductive electrode layer includes the first electrode, the second electrode, and the third electrode, the second conductive electrode layer includes the fourth electrode.

In some implementations, a second insulating layer is disposed on a side of the fourth electrode away from the substrate, a bias wiring is disposed in the peripheral area and on a side of the second insulating layer away from the substrate, and the fourth electrode extends into the peripheral area and is electrically coupled to the bias wiring through a via hole in the second insulating layer.

In some implementations, a material of the bias wiring includes a metal material, and the first light blocking pattern is disposed in the same layer as the bias wiring.

In some implementations, the fingerprint identification module further includes a second light blocking pattern, and the second light blocking pattern and the bias wiring are arranged in a same layer;

an orthographic projection of the second light blocking pattern on the substrate completely covers an orthographic projection of the channel region of the active layer in the thin film transistor on the substrate.

In some implementations, the fingerprint identification module further includes a barrier layer located on a side of the second light blocking pattern away from the substrate and a ground shielding layer on a side of the barrier layer away from the substrate, and an orthographic projection of the ground shielding layer on the substrate completely covers the fingerprint identification area.

In some implementations, the ground shielding layer is electrically coupled to the first light blocking pattern and the second light blocking pattern through via holes in the barrier layer.

In some implementations, the substrate is a flexible substrate, and a third insulating layer is disposed between the substrate and the photoelectric sensing structure.

In a second aspect, an embodiment of the present disclosure further provides a display device, including: the fingerprint identifying module provided in the first aspect, and a display panel located on a side of the first light blocking pattern away from the substrate.

In some implementations, the display panel and the fingerprint identification module are fixed together by optical adhesive;
  or, the display panel and the fingerprint identification module are arranged with an interval therebetween.

In some implementations, the display panel is an OLED display panel, the OLED display panel includes an OLED display back plate, a polarizer and a protective cover plate, which are sequentially stacked in a direction away from the fingerprint identification module, and a material of the protection cover plate includes polyimide.

In some implementations, the display device further includes:
  a middle frame including a bottom plate and a side wall formed by bending an edge of the bottom plate towards a front side, the bottom plate and the side wall form an accommodating groove, the fingerprint identification module and the display panel are fixed in the accommodating groove, and the display panel is located on a side of the fingerprint identification module away from the bottom plate.

In some implementations, the fingerprint identification module is fixed on the bottom plate.

In some implementations, a step-shaped support structure is formed on the side wall, and the display panel is fixed on the step-shaped support structure.

In some implementations, the bottom plate has a through hole formed therein, and the display device further includes a flexible circuit board for fingerprint identification and a chip for fingerprint identification;
  the flexible circuit board for fingerprint identification penetrates through the through hole, one end of the flexible circuit board is electrically coupled to a bonding electrode for fingerprint identification located in the peripheral area of the fingerprint identification module, and another end of the flexible circuit board is electrically coupled to the chip for fingerprint identification located on a back side of the bottom plate.

In some implementations, the display device further includes a flexible circuit board for fingerprint identification and a chip for fingerprint identification, where one end of the flexible circuit board for fingerprint identification is electrically coupled to a bonding electrode for fingerprint identification located in the peripheral area of the fingerprint identification module, and another end of the flexible circuit board for fingerprint identification is electrically coupled to the chip for fingerprint identification;
  the flexible circuit board for fingerprint identification and the chip for fingerprint identification are both located in the accommodating groove.

In a third aspect, an embodiment of the present disclosure further provides a method for manufacturing the fingerprint identification module as set forth in the first aspect, where the method includes:
  providing a substrate, where the substrate includes a fingerprint identification area and a peripheral area which is located at a periphery of the fingerprint identification area;
  forming a photoelectric sensing structure on the substrate, where the photoelectric sensing structure is located on the substrate and in the fingerprint identification area, and the photoelectric sensing structure includes a plurality of gate lines, a plurality of signal sensing lines, and a plurality of pixel units defined by the plurality of gate lines and the plurality of signal sensing lines; where each pixel unit includes a thin film transistor, a gate electrode of the thin film transistor is electrically coupled to one of the gate lines corresponding thereto, and a first electrode of the thin film transistor is electrically coupled to one of the signal sensing lines corresponding thereto; the fingerprint identification area includes a photosensitive region, each pixel unit located in the photosensitive region further includes a photoelectric sensor including a third electrode, a photosensitive pattern and a fourth electrode which are sequentially stacked along a direction away from the substrate, and the third electrode of the photoelectric sensor is coupled to a second electrode of the thin film transistor located in the same pixel unit as that where the photoelectric sensor is located; an area ratio of the photoelectric sensor to the pixel unit corresponding thereto ranges from 40% to 90%.

DESCRIPTION OF DRAWINGS

FIG. 9b is a schematic cross-sectional view of a collimating structure shown in FIG. 9a;

DESCRIPTION OF EMBODIMENTS

Figure 1:
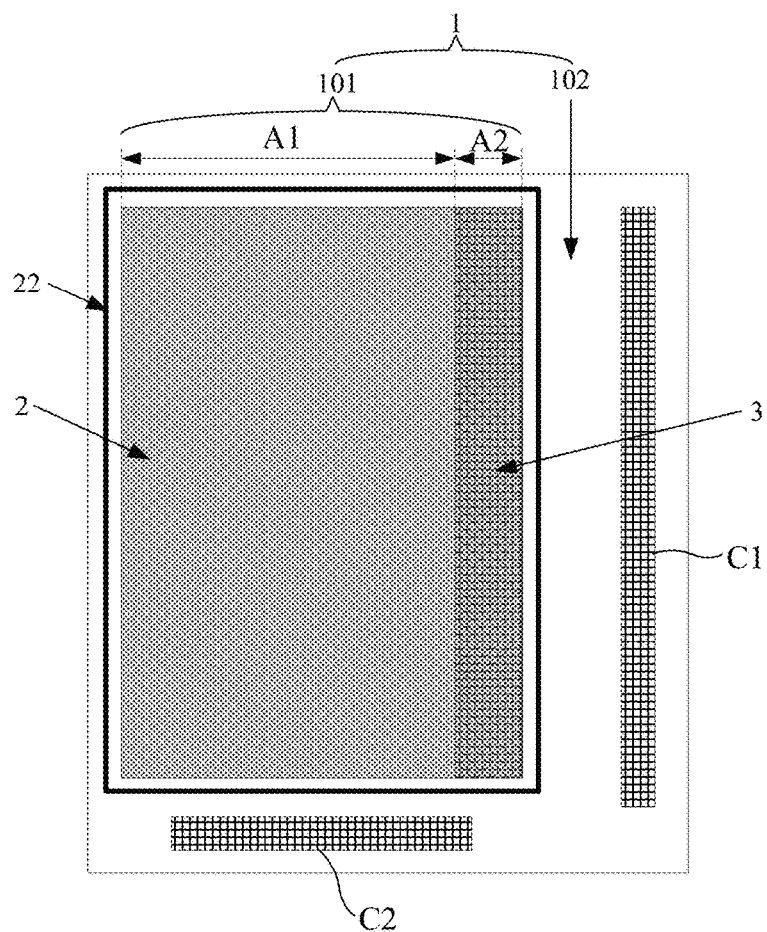
FIG. 1 is a schematic top view of a fingerprint identification module according to an embodiment of the present disclosure.

In order to make those skilled in the art better understand the technical solution of the present disclosure, a fingerprint identification module, a method for manufacturing a fingerprint identification module, and a display device provided in the present disclosure are described in detail below with reference to the accompanying drawings.

Example embodiments will be described more fully hereinafter with reference to the accompanying drawings, but which may be embodied in different forms and should not be construed as limited to the embodiments set forth herein. Rather, these embodiments are provided so that the present disclosure will be more thorough and complete, and will fully convey the scope of the present disclosure to those skilled in the art. Shapes and sizes of various elements in the drawings are not to scale and are merely schematic representations of the present disclosure.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "include" and/or "comprise" or their variants when used in this specification, specify the presence of stated features, integers, steps, operations, elements, and/or components, but do not preclude the presence or addition of one or more other features, integers, steps, operations, elements, components, and/or groups thereof. Embodiments of the present disclosure and features of the embodiments may be combined with each other without conflict.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A display device with a fingerprint identification function generally includes a display panel and a photoelectric sensing structure, when performing fingerprint identification, a fingerprint contacts a surface of the display panel, detection light emitted by the display panel is reflected by the fingerprint to the photoelectric sensing structure, each photoelectric sensor in the photoelectric sensing structure receives the detection light reflected by the fingerprint and generates a corresponding electrical signal based on the received light, the electrical signal is transmitted to an external chip through electric structures such as a driving transistor, a signal sensing line, and the external chip identifies valleys and ridges of the fingerprint at corresponding positions according to the received electrical signal.

Figure 2:
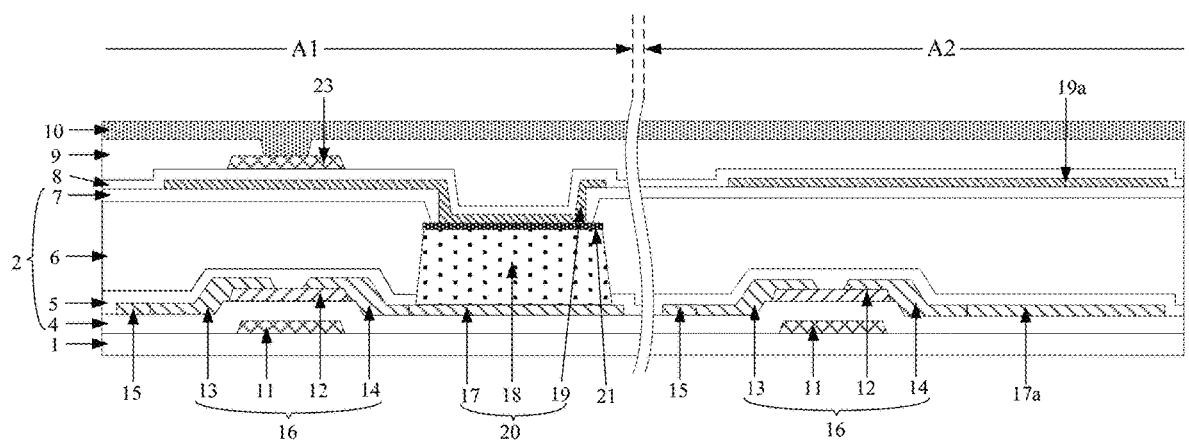
FIG. 2 is a schematic cross-sectional view of a fingerprint identification module in a fingerprint identification area according to an embodiment of the present disclosure.

FIG. 1 is a schematic top view of a fingerprint identification module according to an embodiment of the present disclosure, and FIG. 2 is a schematic cross-sectional view of a fingerprint identification module in a fingerprint identification area according to an embodiment of the present disclosure, and as shown in FIG. 1 and FIG. 2, the fingerprint identification module includes a substrate 1 and a photoelectric sensing structure 2.

The substrate 1 includes a fingerprint identification area 101 and a peripheral area 102 located at a periphery of the fingerprint identification area 101. The substrate 1 may be a glass substrate 1 or a polyimide (PI) flexible substrate 1.

The photoelectric sensing structure 2 is located on the substrate 1 and in the fingerprint identification area 101, and includes a plurality of gate lines 11a, a plurality of signal sensing lines 15, and a plurality of pixel units defined by the plurality of gate lines 11a and the plurality of signal sensing lines 15 in a crossed manner, each pixel unit includes a thin film transistor 16, a gate electrode 11 of the thin film transistor 16 is electrically coupled to one of the gate lines corresponding thereto, and a first electrode 13 of the thin film transistor 16 is electrically coupled to one of the signal sensing lines 15 corresponding thereto.

The fingerprint identification area 101 includes a photosensitive region A1, and the pixel unit located in the photosensitive region A1 further includes a photoelectric sensor 20. An orthographic projection of the photoelectric sensor 20 on the substrate 1 does not overlap with an orthographic projection of an active layer of the thin film transistor 16 on the substrate 1.

In some implementations, a first insulating layer 5 is formed on a side of the thin film transistor 16 away from the substrate 1, and the photoelectric sensor 20 located in the photosensitive region A1 is coupled to a second electrode 14 of the thin film transistor 16 corresponding thereto through a via hole in the first insulating layer 5.

The pixel unit in the photosensitive region A1 is configured to generate a corresponding electrical signal (implemented by the photoelectric sensor 20) according to the received light and output the electrical signal (implemented by the thin film transistor 16) to the signal sensing line corresponding thereto for fingerprint identification. An area ratio of the photoelectric sensor 20 to the pixel unit corresponding thereto ranges from 40% to 90%.

The photoelectric sensor 20 may be a PIN photodiode or a PN photodiode. Specifically, the photoelectric sensor 20 includes a third electrode 17, a photosensitive pattern 18 and a fourth electrode 19 which are sequentially stacked along a direction away from the substrate 1, the third electrode 17 is electrically coupled to the second electrode 14 of the thin film transistor 16 in the same pixel unit as that where the photoelectric sensor 20 is located, and a voltage applied to the third electrode 17 can be controlled through the thin film transistor 16, thereby controlling an operation state of the photoelectric sensor 20.

The photosensitive pattern 18 includes a P-type semiconductor layer and an N-type semiconductor layer (e.g., an N-type Si layer) which are stacked, or includes a P-type semiconductor layer (e.g., a P-type Si layer), an intrinsic semiconductor layer (e.g., an intrinsic Si layer), and an N-type semiconductor layer (e.g., an N-type Si layer) which are stacked. For example, an I layer (intrinsic semiconductor layer) made of a-Si material, a P layer (P-type semiconductor layer) made of a material of a-Si doped with B ions, and an N layer (N-type semiconductor layer) made of a material of a-Si doped with P ions are included.

In some implementations, the fourth electrode 19 is a transparent electrode, and may be made of a transparent metal oxide material such as Indium Tin Oxide (ITO), Indium Zinc Oxide (IZO), Gallium Zinc Oxide (GZO), or the like. In some implementations, an ohmic contact layer 21 is disposed between the fourth electrode 19 and the photosensitive pattern 18 for reducing a contact resistance between the fourth electrode 19 and the photosensitive pattern 18, the ohmic contact layer 21 may be made of a metal material, and the ohmic contact layer 21 as a whole has a relatively good light transmittance. The third electrode 17 is a metal electrode, and is made of a metal material such as copper (Cu), aluminum (Al), or titanium (Ti) or an alloy material.

It should be noted that, in the embodiment of the present disclosure, a structure being "transparent" means that the structure can transmit light, and does not mean that the structure has a light transmittance of 100%.

In the embodiment of the present disclosure, the pixel unit located in the photosensitive region A1 outputs the electrical signal corresponding to the received light to the signal sensing line 15 corresponding thereto, so that the electrical signal is to be processed by an external chip to obtain valley and ridge information at a corresponding position, thereby implementing the fingerprint identification.

It should be noted that, the peripheral area 102 of the fingerprint identification module generally includes a bonding region, and a bonding electrode is disposed in the bonding region. According to functions to be implemented, the bonding region generally includes a bonding region C1 for bonding a gate driver chip and a bonding region C2 for bonding a data driver chip, the bonding electrode in bonding region C1 is for bonding the gate driver chip, and the bonding electrode in the bonding region C2 is for bonding the data driver chip. The arrangement of the bonding region and the bonding electrode is conventional in the art, and the detailed description thereof is omitted.

Figure 3:
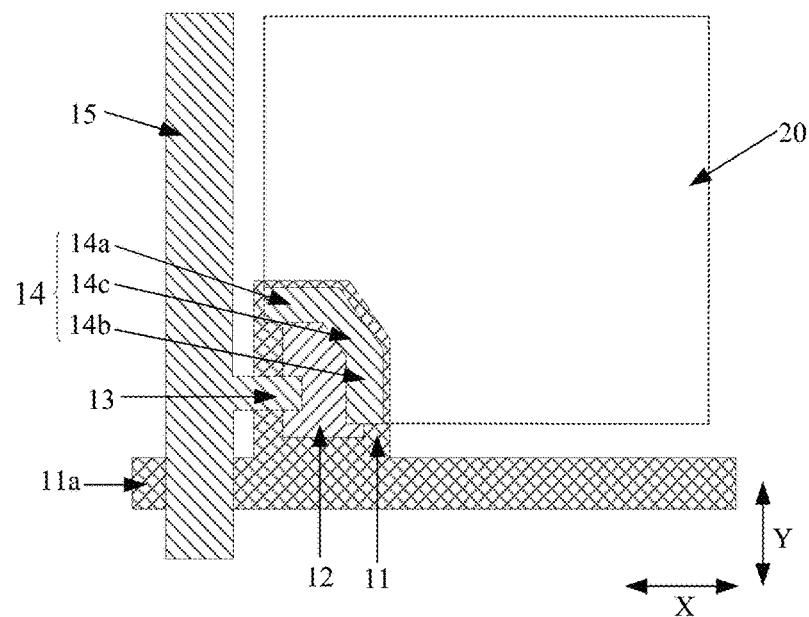
FIG. 3 is a schematic top view of a pixel unit and a gate line and a signal sensing line corresponding thereto according to an embodiment of the present disclosure.

FIG. 3 is a schematic top view of a pixel unit and a gate line and a signal sensing line corresponding to the pixel unit according to an embodiment of the present disclosure, as shown in FIG. 3, the thin film transistor 16 includes a gate electrode 11, an active layer 12, a first electrode 13 and a second electrode 14, where the first electrode 13 is a source electrode of the thin film transistor 16, and the second electrode 14 is a drain electrode of the thin film transistor 16. A region of the active layer 12 between the first electrode 13 and the second electrode 14 is a channel region, and the channel region of the thin film transistor 16 is in an inverted L shape or an arc shape.

Figure 5:
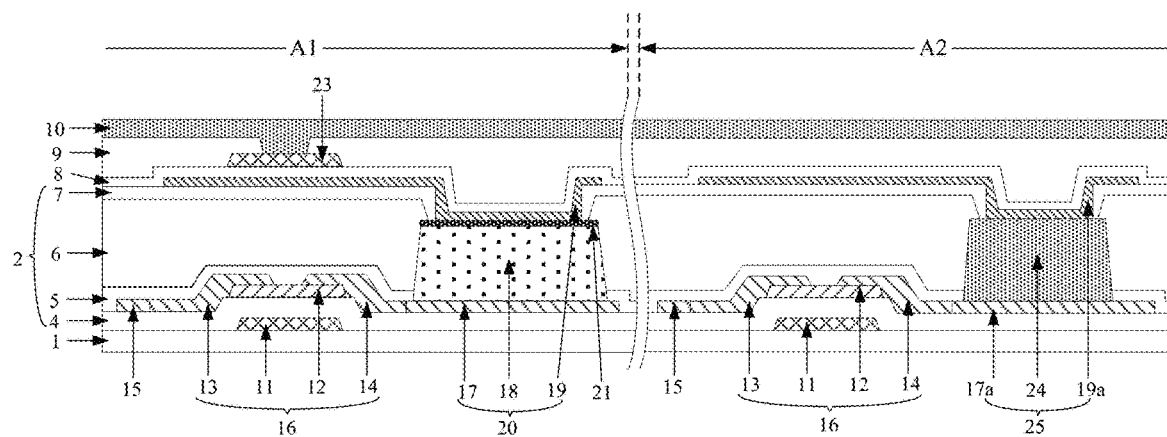
FIG. 5 is a schematic cross-sectional view of a fingerprint identification module in a fingerprint identification area according to an embodiment of the present disclosure.

In some implementations, the gate lines 11a extend along a first direction X, and the signal sensing lines 15 extend along a second direction Y, the first direction X being perpendicular to the second direction Y; in FIG. 5, the first direction X is a horizontal direction, and the second direction Y is a vertical direction. The first electrode 13 has a rectangular cross section parallel to a plane where the substrate 1 is located, and has a first side edge and a second side edge which are oppositely arranged in the first direction and a third side edge and a fourth side edge which are oppositely arranged in the second direction, the first electrode 13 is electrically coupled to the signal sensing line 15 nearest to the first side edge of its own, and the gate electrode 11 is electrically coupled to the gate line 11a nearest to the third side edge of the first electrode 13; the second electrode 14 includes a first conductive part 14a and a second conductive part 14b, the first conductive part 14a extends in the first direction and is arranged opposite to the second side edge of the first electrode 13, the second conductive part 14b extends in the second direction and is arranged opposite to the fourth side edge of the first electrode 13, and the first conductive part 14a is electrically coupled to the second conductive part 14b.

Unlike a conventional case in which the source electrode and the drain electrode of the thin film transistor 16 are stripe-shaped and parallel to each other, in the embodiment of the present disclosure, the source electrode is rectangular, and the drain electrode is disposed opposite to two side edges (a second side edge and a fourth side edge) of the source electrode, in such case, a width of the channel region of the active layer 12 is increased. Under a condition that a required channel width-length ratio of the thin film transistor 16 is constant, a size of the source electrode can be correspondingly reduced (an overall length of the drain electrode is substantially equal to a length of the strip-shaped drain electrode of the thin film transistor 16 in the conventional case), and in such case, an overlap capacitance formed between the source electrode and other structures (for example, a capacitance between the source electrode and the gate electrode 11) can be reduced, which is beneficial to reducing self-noise of the thin film transistor 16 and improving an accuracy of fingerprint identification.

In some implementations, the second electrode 14 further includes a third conductive part 14c, where the first conductive part 14a, the second conductive part 14b and the third conductive part 14c are arranged in a same layer, a direction in which the third conductive part 14c extends intersects with the first direction and the second direction, and two ends of the third conductive part 14c are respectively coupled to the first conductive part 14a and the second conductive part 14b. In such case, the channel region of the active layer 12 has an inverted "L" shape.

It should be noted that the thin film transistor 16 having the inverted "L" shaped channel region is an alternative implementation of the present disclosure, and does not limit the technical solution of the present disclosure.

In practical applications, the process that the pixel unit in the photosensitive region generates the electrical signal and finally transmits the electrical signal to the external chip is interfered by noise, so that the electrical signal received by the external chip is inaccurate, and the accuracy of fingerprint identification is influenced. To solve such problem, noise reduction processing may be performed on the electrical signal output by the pixel unit in the photosensitive region A1 and received by the external chip before forming an image based on the electrical signal.

In some implementations, in order to facilitate subsequent noise reduction processing on the electrical signal output by the pixel unit located in the photosensitive region A1, a dummy region A2 located at a periphery of the photosensitive region A1 is further disposed in the fingerprint identification area 101, and the pixel unit located in the dummy region A2 is configured to output a reference noise signal to the signal sensing line corresponding thereto, where the reference noise signal may be used to perform the noise reduction processing on the electrical signal output by the pixel unit located in the photosensitive region A1 and received by the external chip, which is beneficial to improving an accuracy of identifying fingerprint information in the photosensitive region A1.

In some implementations, multiple pixel units are disposed in the dummy region A2, and noise signals output by all the pixel units in the dummy region a2 may be subjected to a preset process to obtain the reference noise signal (for example, the reference noise signal is obtained by averaging all the noise signals, or the noise signal with a largest current value is selected as the reference noise signal, or the noise signal with a smallest current value is selected as the reference noise signal, etc.); then, noise reduction processing is performed on the electrical signal output by the pixel unit in the photosensitive region A1 based on the reference noise signal. As an example, a magnitude of current (or voltage) of the reference noise signal may be directly subtracted from a magnitude of current (or voltage) of the electrical signal output by the pixel unit in the photosensitive region A1. It should be noted that, a specific algorithm for performing noise reduction processing on the signal to be subjected to noise reduction based on the noise signal is not limited in the present disclosure.

Figure 4A:
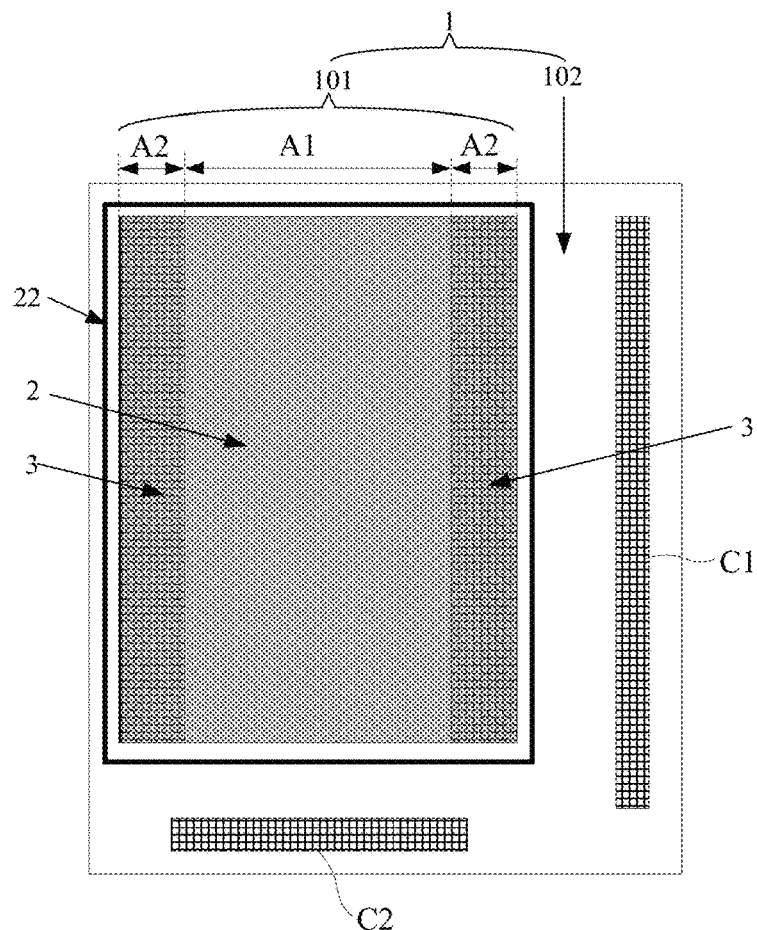
FIG. 4a is a schematic top view of a fingerprint identification module according to an embodiment of the present disclosure.
Figure 4B:
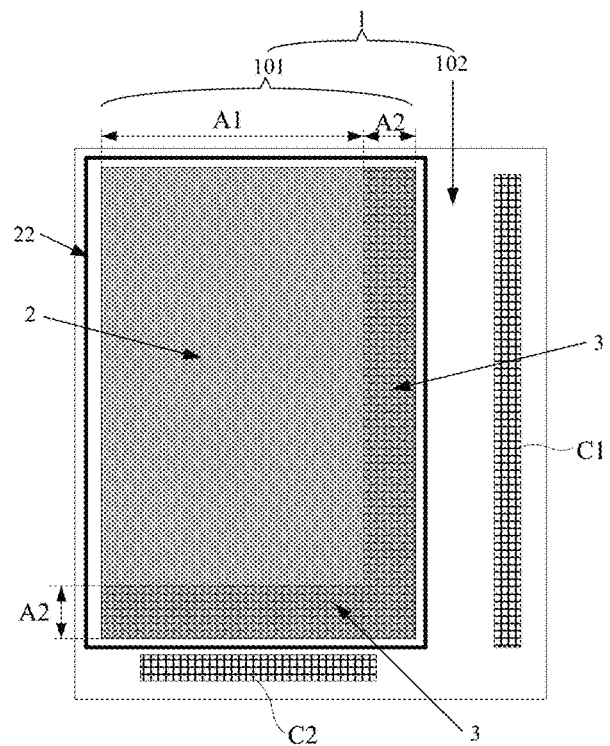
FIG. 4b is a schematic top view of a fingerprint identification module according to an embodiment of the present disclosure.
Figure 4C:
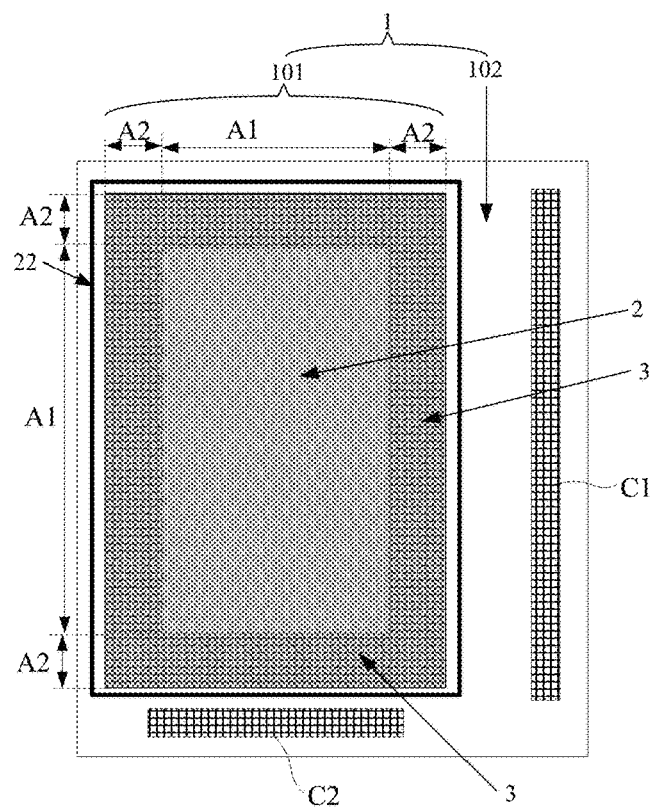
FIG. 4c is a schematic top view of a fingerprint identification module according to an embodiment of the present disclosure.

FIG. 4a is a schematic top view of a fingerprint identification module according to an embodiment of the present disclosure, FIG. 4b is a schematic top view of a fingerprint identification module according to an embodiment of the present disclosure, FIG. 4c is a schematic top view of a fingerprint identification module according to an embodiment of the present disclosure, and as shown in FIG. 1 and FIGS. 4a to 4b, FIG. 1 illustrates a case where the dummy region A2 is located on one side of the photosensitive region A1, FIG. 4a illustrates a case where the dummy region A2 is located on two opposite sides of the photosensitive region A1, FIG. 4b illustrates a case where the dummy region A2 is located on two adjacent sides (intersecting sides) of the photosensitive region A1, and FIG. 4c illustrates a case where the dummy region A2 is located on four sides of the photosensitive region A1.

Certainly, in some implementations, the dummy region A2 may be located on different three sides of the photosensitive region A1, which is not shown in the drawings.

In some implementations, the thin film transistor 16 included in the pixel unit located in the photosensitive region A1 has the same structure, shape and size as the thin film transistor 16 included in the pixel unit located in the dummy region A2. In such case, the self-noise of the thin film transistor 16 included in the pixel unit located in the photosensitive region A1 is the same or approximately the same as the self-noise of the thin film transistor 16 included in the pixel unit located in the dummy region A2; the noise reduction processing is performed on the electrical signal output by the pixel unit (the thin film transistor 16) in the photosensitive region A1 based on the noise signal output by the pixel unit (the thin film transistor 16) in the dummy region A2, resulting in a relatively good noise reduction effect, and facilitating an improvement of the accuracy of fingerprint identification.

Referring to FIG. 2, in some implementations, a planarization layer 6 and a passivation layer 7 are sequentially disposed on a side of the photosensitive pattern 18 away from the substrate 1, via holes corresponding to photosensitive patterns 18 one to one are formed in the planarization layer 6 and the passivation layer 7, so that a surface of the photosensitive pattern 18 away from the substrate 1 is at least partially exposed, and the fourth electrode 19 is located on a side of the passivation layer 7 away from the substrate 1 and is electrically coupled to the photosensitive pattern 18 corresponding thereto through the via hole in the planarization layer 6 and the passivation layer 7; the pixel unit located in the dummy region A2 further includes a fifth electrode 17a and a sixth electrode 19a, where the fifth electrode 17a is coupled to the second electrode 14 of the thin film transistor 16 in the dummy region A2, and the planarization layer 6 and the passivation layer 7 are disposed between the fifth electrode 17a and the sixth electrode 19a. In some implementations, the fifth electrode 17a and the second electrode 14 of the thin film transistor 16 may be disposed in a same layer or in different layers.

Referring to FIG. 2, in some implementations, a planarization layer 6 and a passivation layer 7 are sequentially disposed on a side of the photosensitive pattern 18 away from the substrate 1, via holes corresponding to photosensitive patterns 18 one to one are formed in the planarization layer 6 and the passivation layer 7, so that a surface of the photosensitive pattern 18 away from the substrate 1 is at least partially exposed, and the fourth electrode 19 is located on a side of the passivation layer 7 away from the substrate 1 and is electrically coupled to the photosensitive pattern 18 corresponding thereto through the via hole in the planarization layer 6 and the passivation layer 7; the pixel unit located in the dummy region A2 further includes a fifth electrode 17a and a sixth electrode 19a, the fifth electrode 17a is coupled to the second electrode 14 of the thin film transistor 16 in the dummy region A2, the fifth electrode 17a and the third electrode 17 are disposed in a same layer and made of a same material, the sixth electrode 19a and the fourth electrode 19 are disposed in a same layer and made of a same material, and the first insulating layer 5, the planarization layer 6 and the passivation layer 7 are arranged between the fifth electrode 17a and the sixth electrode 19a.

In the case shown by FIG. 2, no photosensitive pattern 18 is disposed in the pixel unit located in the dummy region A2 (filled by the planarization layer), that is, the pixel unit located in the dummy region A2 would not generate a photoelectric effect, and the electrical signal output by the pixel unit located in the dummy region A2 can be used as the reference noise signal.

FIG. 5 is a schematic cross-sectional view of a fingerprint identification module in a fingerprint identification area according to an embodiment of the present disclosure, and as shown in FIG. 5, unlike the pixel unit located in the dummy region A2 shown in FIG. 2, the pixel unit located in the dummy region A2 shown in FIG. 5 not only includes the thin film transistor 16, but also includes a sensor contrast structure 25, where the sensor contrast structure 25 includes a fifth electrode 17a, a contrast pattern 24 and a sixth electrode 19a which are sequentially stacked in a direction away from the substrate 1, where the fifth electrode 17a is electrically coupled to the second electrode 14 of the thin film transistor 16 corresponding thereto, a dielectric constant of the contrast pattern 24 is substantially the same as that of the photosensitive pattern 18, and the contrast pattern 25 is made of a non-photoelectric material. A connection mode between the sixth electrode 19a and the contrast pattern 24 in the sensor contrast structure 25 is the same as that between the fourth electrode 19 and the photosensitive pattern 18 in the photoelectric sensing structure 2.

In the embodiment of the present disclosure, the sensor contrast structure 25 has a structure similar to that of the photoelectric sensing structure 2, and the dielectric constant of the contrast pattern 24 is the same as that of the photosensitive pattern 18, so that the self-noise of the pixel unit located in the dummy region A2 and the self-noise of the pixel unit located in the photosensitive region A1 are the same or approximately the same, and in such case, the noise reduction processing is performed on the electrical signal output by the pixel unit in the photosensitive region A1 based on the noise signal output by the pixel unit in the dummy region A2, resulting in a relatively good noise reduction effect, and facilitating an improvement of the accuracy of fingerprint identification. In addition, even if there is light irradiation in the dummy region A2, since the contrast pattern 24 is made of the non-photoelectric material, the contrast pattern 24 would not generate current due to the light irradiation, and an influence of light irradiation on the noise signal output by the pixel unit in the dummy region A2 can be avoided.

Figure 6:
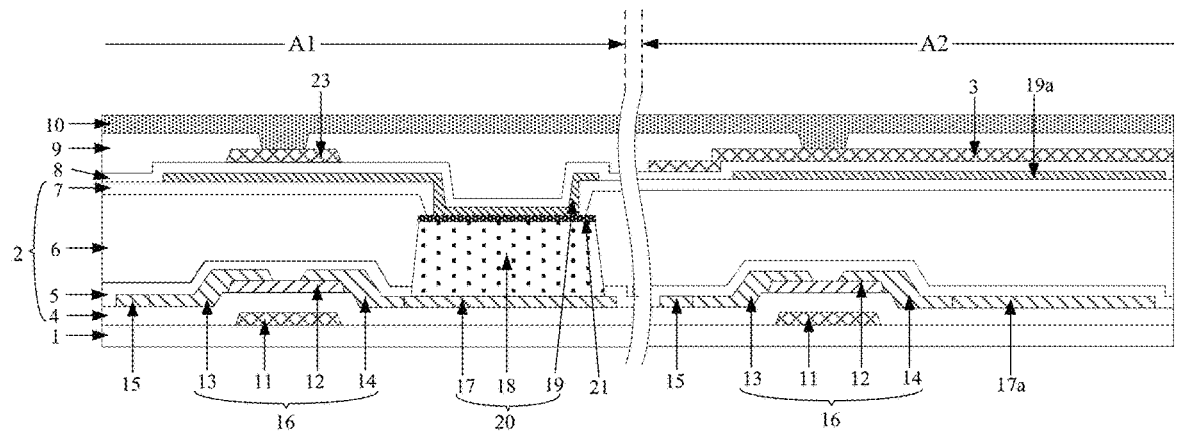
FIG. 6 is a schematic cross-sectional view of a fingerprint identification module in a fingerprint identification area according to an embodiment of the present disclosure.
Figure 7:
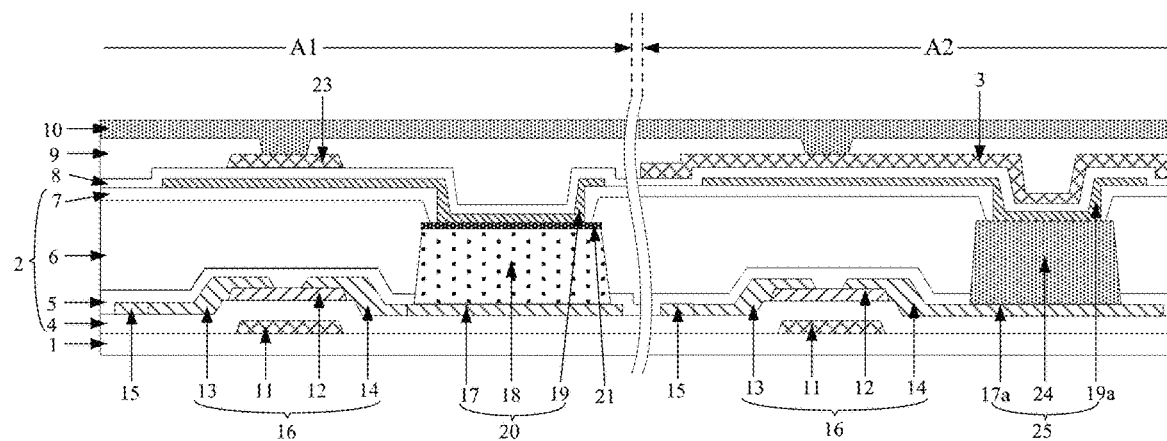
FIG. 7 is a schematic cross-sectional view of a fingerprint identification module in a fingerprint identification area according to an embodiment of the present disclosure.

FIG. 6 is a schematic cross-sectional view of a fingerprint identification module in a fingerprint identification area according to an embodiment of the present disclosure, FIG. 7 is a schematic cross-sectional view of a fingerprint identification module in a fingerprint identification area according to an embodiment of the present disclosure, and as shown in FIGS. 6 and 7, unlike cases shown in FIGS. 2 and 5, in the case shown in FIG. 6, the fingerprint identification module further includes a first light blocking pattern 3, the first light blocking pattern 3 is located on a side of the sixth electrode 19a away from the substrate 1, and an orthographic projection of the first light blocking pattern 3 on the substrate 1 completely covers the dummy region A2 and does not cover the photosensitive region A1.

By providing the first light blocking pattern 3, light can be effectively prevented from irradiating to the pixel unit located in the dummy region A2, so as to guarantee that the noise signal output by the pixel unit located in the dummy region A2 is not influenced by light irradiation, which is favorable to promoting subsequent noise reduction effect.

Referring to FIGS. 2, 5 to 7, the third electrode 17, the fifth electrode 17a and the second electrode 14 are disposed in a same layer, that is, each of the third electrode 17 and the fifth electrode 17a is directly coupled to the second electrode 14 corresponding thereto.

In some implementations, the photoelectric sensing structure 2 includes the gate electrode 11 (typically made of a metal material and having a thickness ranging from 3000 Å to 5000 Å), a gate insulating layer 4 (typically made of an inorganic insulating layer material including SiNx or SiO$_2$), the active layer 12 (typically made of a-Si or monocrystalline silicon), a first conductive electrode layer (typically made of a metal material and having a thickness ranging from 3000 Å to 5000 Å, and specifically including the first electrode 13, the second electrode 14, the third electrode 17, the fifth electrode 17a, and the signal sensing line 15), the first insulating layer 5 (typically made of an inorganic insulating layer material including SiNx or SiO$_2$), the photosensitive pattern 18 (typically made of a photoelectric conversion material and having a thickness ranging from 2000 Å to 10000 Å), the planarization layer 6 (typically made of an organic material and having a thickness ranging from 10000 Å to 50000 Å), the passivation layer 7 (typically made of SiNx or SiO$_2$ and having a thickness ranging from 2000 Å to 10000 Å for ensuring adhesion between a subsequent film layer and an upper surface of the planarization layer 6), and a second conductive electrode layer (typically made of a transparent conductive material and having a thickness ranging from 300 Å to 1000 Å, and specifically including the fourth electrode 19 and the sixth electrode 19a) which are sequentially stacked along a direction away from the substrate 1. The gate electrode 11, the active layer 12, the first electrode 13, and the second electrode 14 constitute the thin film transistor 16, and the third electrode 17, the photosensitive pattern 18, and the fourth electrode 19 constitute the photoelectric sensor 20.

Correspondingly, a sequence of manufacturing layers in the fingerprint identification area 101 includes: the gate electrode 11→the gate insulating layer 4→the active layer 12→the first conductive electrode layer→the first insulating layer 5→the third electrode 17→the photosensitive pattern 18→the planarization layer 6→the passivation layer 7→the second conductive electrode layer. The fourth electrode 19 is electrically coupled to the photosensitive pattern 18 through via holes in the passivation layer 7 and the planarization layer 6, where the planarization layer 6 and the passivation layer 7 may be respectively subjected to patterning processes, and thus the via holes in such two layers may be different in size; in some implementations, a size of the via hole in the passivation layer 7 is smaller than a size of the via hole in the planarization layer 6. Illustratively, a radius of the via hole in the passivation layer 7 is smaller than a radius of the via hole corresponding thereto in the planarization layer 6 by 3.5 μm to 4 μm.

It should be noted that, when the contrast pattern 24 is provided in the dummy region A2 and the material of the contrast pattern 24 is different from the material of the photosensitive pattern 18, a process of forming the contrast pattern 24 is needed between forming the third electrode 17/the fifth electrode 17a and forming the planarization layer 6, in addition to forming the photosensitive pattern 18.

Figure 8:
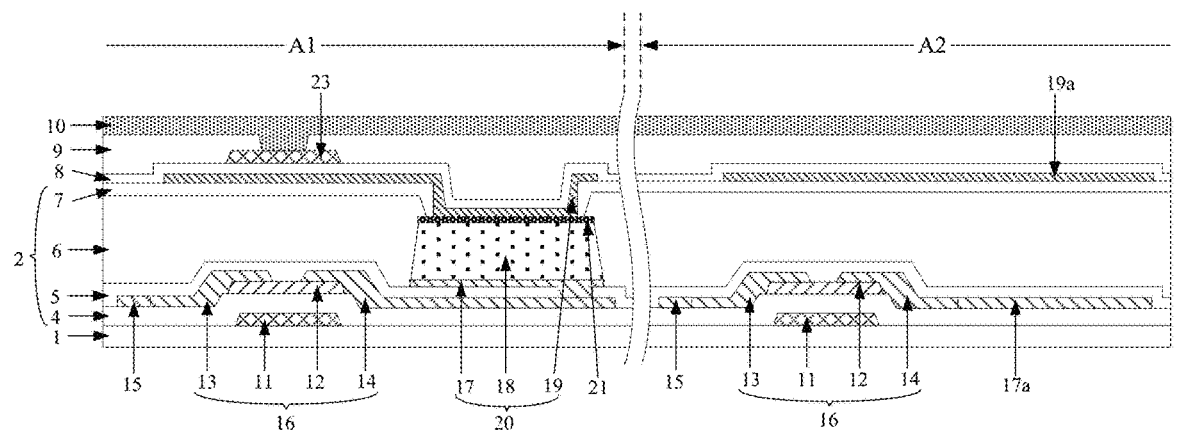
FIG. 8 is a schematic cross-sectional view of a fingerprint identification module in a fingerprint identification area according to an embodiment of the present disclosure.

FIG. 8 is a schematic cross-sectional view of a fingerprint identification module in a fingerprint identification area according to an embodiment of the present disclosure, and as shown in FIG. 8, different from the arrangement of the third electrode 17 and the second electrode 14 in the same layer as shown in FIG. 2 and FIG. 5 to FIG. 7, in the case shown in FIG. 8, the third electrode 17 and the second electrode 14 are arranged in different layers, and each third electrode 17 is coupled to the second electrode 14 corresponding thereto through a via hole in the first insulating layer 5; such case should also fall within the scope of the present disclosure.

In addition, when the third electrode 17 of the photoelectric sensor 20 is electrically coupled to the second electrode 14 of the thin film transistor 16 through a via hole in the first insulating layer 5, the via hole is preferably disposed at an edge position of the contrast pattern 24, which is advantageous for reducing a leakage current of the photoelectric sensor 20.

Referring to FIGS. 1 to 8 again, in some implementations, a second insulating layer 8 is disposed on a side of the fourth electrode 19 away from the substrate 1, a bias wiring 22 is disposed on a side of the second insulating layer 8 away from the substrate 1 and in the peripheral area 102, and the fourth electrode 19 extends to the peripheral area 102 and is electrically coupled to the bias wiring 22 through a via hole in the second insulating layer 8.

In some implementations, a material of the bias wiring 22 includes a metal material, and the first light blocking pattern 3 is disposed in the same layer as the bias wiring 22. That is, the first light blocking pattern 3 can be simultaneously formed while forming the bias wiring 22, resulting in an effectively shortened production period and a reduced production cost. In addition, generally, the bias wiring 22 is disposed in the same layer as the bonding electrode in the peripheral area 102.

In some implementations, the fingerprint identification module further includes a second light blocking pattern 23, the second light blocking pattern 23 and the bias wiring 22 are disposed in a same layer, and an orthographic projection of the second light blocking pattern 23 on the substrate 1 completely covers an orthographic projection of the channel region of the active layer 12 in the thin film transistor 16 on the substrate 1. The second light blocking pattern 23 is configured to prevent external light from being irradiated to the channel region of the active layer 12, so as to prevent electrical characteristics of the thin film transistor 16 from being shifted due to light irradiation.

In some implementations, the fingerprint identification module further includes a barrier layer 9 and a ground shielding layer 10, and the barrier layer 9 is located on a side of the second light blocking pattern 23 away from the substrate 1, the ground shielding layer 10 is located on a side of the barrier layer 9 away from the substrate 1, and an orthographic projection of the ground shielding layer 10 on the substrate 1 completely covers the fingerprint identification area 101. In the embodiment of the present disclosure, by providing the ground shielding layer 10, noise influence caused by electromagnetic coupling between the photoelectric sensor 20 and a display panel 28 can be effectively shielded, which is beneficial to improving the accuracy of fingerprint identification.

In some implementations, the ground shielding layer 10 is electrically coupled to the second light blocking pattern 23 through a via hole in the barrier layer 9, so that charge accumulation and discharge on the second light blocking pattern 23 can be effectively prevented. In addition, when the first light blocking pattern 3 and the bias wiring 22 are arranged in the same layer, the ground shielding layer 10 is electrically coupled to the first light blocking pattern 3 through a via hole in the barrier layer 9, so that charge accumulation and discharge on the first light blocking pattern 3 can be effectively prevented.

Figure 9A:
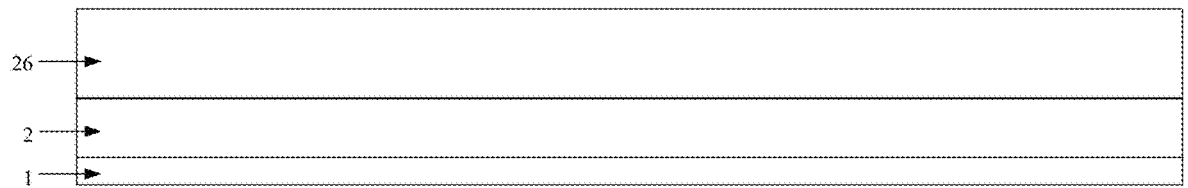
FIG. 9a is a schematic cross-sectional view of a fingerprint identification module in a fingerprint identification area according to an embodiment of the present disclosure.
Figure 9B:
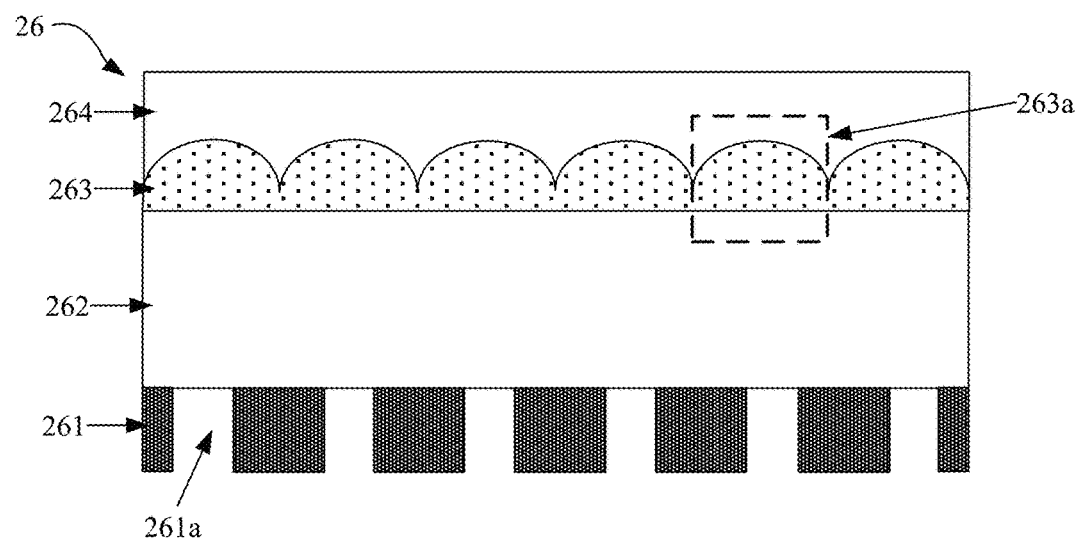
Figure 9C:
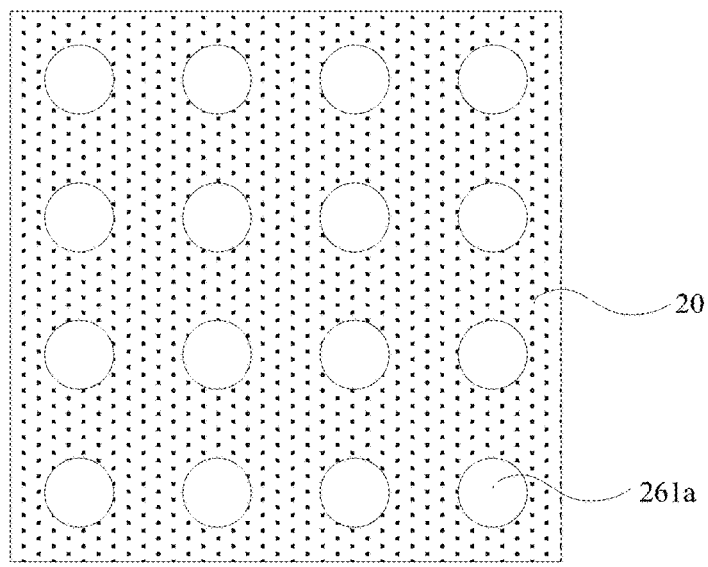
FIG. 9c is a schematic top view of a photoelectric sensor corresponding to a plurality of light-transmitting holes according to an embodiment of the present disclosure.
Figure 9D:
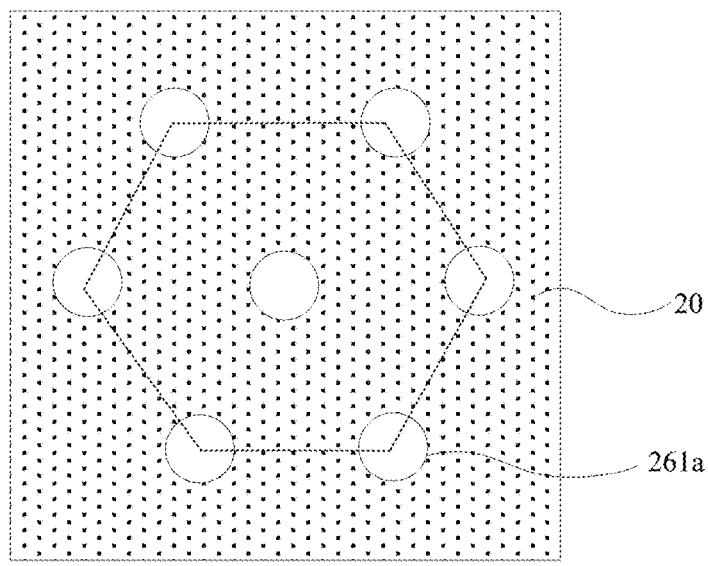
FIG. 9d is a schematic top view of a photoelectric sensor corresponding to a plurality of light-transmitting holes according to an embodiment of the present disclosure.

FIG. 9a is a schematic cross-sectional view of a fingerprint identification module in a fingerprint identification area according to an embodiment of the present disclosure, FIG. 9b is a schematic cross-sectional view of a collimating structure shown in FIG. 9a, FIG. 9c is a schematic top view of a photoelectric sensor corresponding to a plurality of light-transmitting holes according to an embodiment of the present disclosure, and FIG. 9d is a schematic top view of a photoelectric sensor corresponding to a plurality of light-transmitting holes according to an embodiment of the present disclosure, as shown in FIGS. 9a to 9d, in some implementations, the fingerprint identification module further includes a collimating structure 26, the collimating structure 26 is located on a side of the photoelectric sensing structure 2 away from the substrate 1, and the collimating structure 26 at least covers the photosensitive region A1; the collimating structure 26 includes an aperture layer 261, and the aperture layer 261 includes a plurality of light-transmitting holes 261a arranged in an array. The light-transmitting holes 261a may serve to collimate light.

In some implementations, each photoelectric sensor 20 corresponds to multiple light-transmitting holes 261a, and each light-transmitting hole 261a corresponds to one photoelectric sensor 20. Further, the number of the light-transmitting holes 261a corresponding to each photoelectric sensor 20 is the same; the number of the light-transmitting holes 261a corresponding to each photoelectric sensor 20 ranges from 4 to 100. The number of the light-transmitting holes 261a corresponding to each photoelectric sensor 20 specifically refers to the number of the light-transmitting holes 261a located in a region where the photosensitive pattern 18 is located in the photoelectric sensor 20. An intensity of light signal received by the photoelectric sensor 20 is related to the number of the light-transmitting holes 261a corresponding to the photoelectric sensor 20. Generally, the greater the number of the light-transmitting holes 261a, the stronger the intensity of the light signal received by the photoelectric sensor 20, and the greater the magnitude of the current of the electrical signal output by the photoelectric sensor 20, and the more advantageous the detection of the electrical signal. Meanwhile, when the number of the light-transmitting holes 261a is too large, the distance between adjacent light-transmitting holes 261a is reduced, the risk of light crosstalk is higher, and based on consideration of factors such as difficulty of signal detection and risk of light crosstalk, the number of the light-transmitting holes 261a in the embodiment of the present disclosure ranges from 4 to 100; in principle, each photoelectric sensor 20 may correspond to at least one light-transmitting hole 261a. In addition, the number of the light-transmitting holes 261a corresponding to each photoelectric sensor 20 being the same helps to prevent a quality of formed image from being affected by a difference in the number of the light-transmitting holes 261a.

The plurality of light-transmitting holes 261a corresponding to the same photoelectric sensor 20 are uniformly distributed in the region where the photosensitive pattern 18 is located in the photoelectric sensor 20. As an example, referring to FIG. 9c, the plurality of light-transmitting holes 261a corresponding to the same photoelectric sensor 20 are arranged in an array in rows and columns, and distances between any two light-transmitting holes 261a adjacent in a row direction or adjacent in a column direction are equal to each other. As another example, referring to FIG. 9d, the plurality of light-transmitting holes 261a corresponding to the same photoelectric sensor 20 are arranged in a hexagonal pattern, and distances between any two adjacent light-transmitting holes 261a are equal to each other. Certainly, the light-transmitting holes 261a in the embodiment of the present disclosure may also be arranged in other arrangement modes, which will not be described in detail one by one in the present disclosure Referring to FIG. 9b, in some implementations, the collimating structure 26 further includes a medium light-transmitting layer 262, a lens layer 263 and a flat light-transmitting layer 264 which are located on a side of the aperture layer 261 away from the substrate 1 and are sequentially stacked along a direction away from the substrate 1; the lens layer 263 includes a plurality of convex lenses 263a corresponding to the light-transmitting holes 261a one to one, and an optical axis of each convex lens 263a passes through the light-transmitting hole 261a corresponding thereto.

Further, the convex lenses 263a are plano-convex lenses, a planar surface of each plano-convex lens 263a faces the medium light-transmitting layer 262 and is attached to a surface of the medium light-transmitting layer 262, and a convex surface of the plano-convex lens 263a faces the flat light-transmitting layer 264 and is attached to a surface of the flat light-transmitting layer 264.

In the embodiment of the present disclosure, the convex lens 263a can modulate a propagation direction of the light reflected by the fingerprint, and reduce an inclination angle of part of the light, so that a propagation direction of a convergent light beam formed is concentrated. The aperture layer 261 allows only a convergent light beam with a specific angle to pass through, and collimates the convergent light beam output by the convex lenses, so that direction consistency of the convergent light beam received by the photoelectric sensor 20 is improved. The light-transmitting holes 261a of the aperture layer 261 correspond to the convex lenses 263a one-to-one, so that the light converged by each convex lens 263a can be collimated in a same way through holes with a same size, and a difference between signals is reduced.

It should be noted that the collimating structure 26 may be attached and fixed to the photoelectric sensing structure 2 through an optically clear adhesive (OCA), or directly formed on the photoelectric sensing structure 2 through processes such as thin film deposition and thin film patterning, and both cases belong to the protection scope of the present disclosure.

Figure 10:
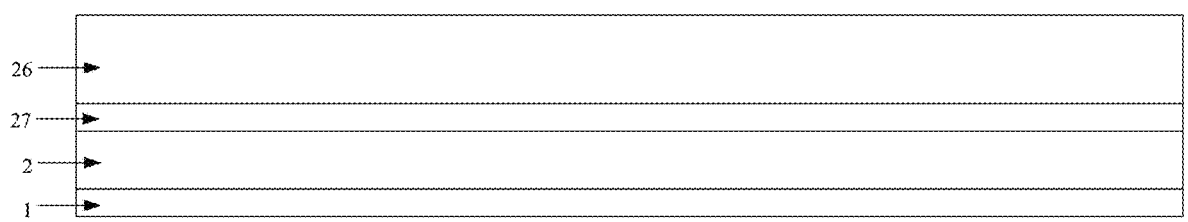
FIG. 10 is a schematic cross-sectional view of a fingerprint identification module in a fingerprint identification area according to an embodiment of the present disclosure.

FIG. 10 is a schematic cross-sectional view of a fingerprint identification module in a fingerprint identification area according to an embodiment of the present disclosure, and as shown in FIG. 10, in some implementations, the fingerprint identification module further includes an invisible light filter layer 27. The invisible light filter layer 27 is located on a side of the photoelectric sensor 20 away from the substrate 1, and is configured to filter out invisible light in the transmitted light.

In some implementations, the invisible light filter layer 27 is an infrared filter layer configured to filter out infrared light of the transmitted light. In strong ambient light, most of the light transmitted through a finger is infrared light (with a wavelength ranging from 760 nm to 1 mm), and detection light reflected by the fingerprint and emitted from the display panel 28 is visible light (with a wavelength ranging from 400 nm to 700 nm). In the embodiment of the present disclosure, the infrared filter layer is configured to block infrared light and enable visible light to pass through, so that the detection light reflected by the finger (in particular, fingerprint) can pass through but infrared light passing through the finger cannot pass through, thereby reducing an influence of ambient light signal on the photoelectric sensor 20 and improving anti-glare performance of a product.

In some implementations, the infrared filter layer includes an infrared absorbing layer having a function for absorbing infrared light or an infrared reflecting layer having a function for reflecting infrared light. When the infrared filter layer includes the infrared absorbing layer with the function for absorbing infrared light, the infrared filter layer may be formed of a material with a function for filtering infrared light; when the infrared filter layer includes the infrared reflecting layer having the function for reflecting infrared light, the infrared filter layer may be formed of a material having a function for reflecting infrared light or a stack of layers of materials having different dielectric constants.

In some implementations, when the fingerprint identification module includes the collimating structure 26, the invisible light filter layer 27 is located between the collimating structure 26 and the photoelectric sensor 20 or the invisible light filter layer 27 is integrated within the collimating structure 26.

Referring to FIG. 10, the invisible light filter layer 27 is provided as a separate structure between the collimating structure 26 and the photoelectric sensor 20.

The invisible light filter layer 27 may be attached to the photoelectric sensing structure 2 by optical adhesive (e.g., OCA), or may be directly formed on a surface of the photoelectric sensing structure 2 by a coating process, and both cases belong to the protection scope of the present disclosure.

Figure 11:
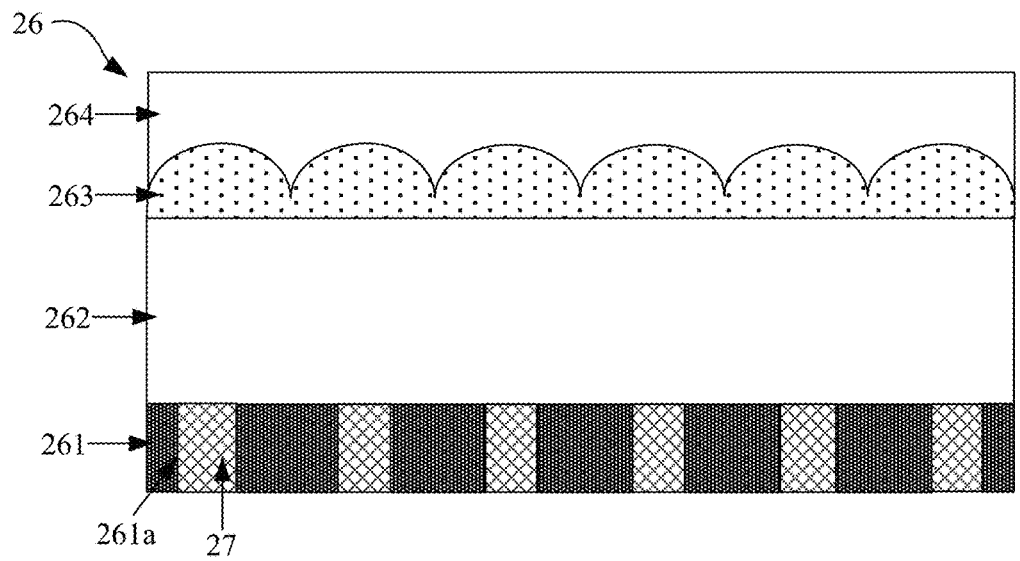
FIG. 11 is a schematic diagram illustrating an infrared filter layer filled in light-transmitting holes according to an embodiment of the present disclosure.

FIG. 11 is a schematic diagram illustrating an invisible light filter layer filled in light-transmitting holes according to an embodiment of the present disclosure, and as shown in FIG. 11, when the invisible light filter layer 27 is integrated in the collimating structure 26, as an example, the invisible light filter layer 27 is filled in the light-transmitting holes 261a.

With continued reference to FIG. 9b, as still another example, when the collimating structure 26 includes the medium light-transmitting layer, the lens layer 263 and the flat light-transmitting layer 264, at least one of the medium light-transmitting layer and the flat light-transmitting layer 264 is made of an organic material having a function for absorbing invisible light (e.g., infrared light) function and is multiplexed as (i.e., common to) the invisible light filter layer 27.

In some implementations, the substrate 1 is a flexible substrate 1, and a third insulating layer (not shown) is disposed between the substrate 1 and the photoelectric sensing structure 2. Before forming the photoelectric sensing structure 2 on the PI flexible substrate 1, the third insulating layer with a certain thickness is formed on the substrate 1, where a material of the third insulating layer includes SiNx and SiO$_2$, so that water and oxygen can be prevented from permeating from a back surface of the PI flexible substrate 1 after being stripped off to damage film layers in the device, and the deposition of a subsequent film layer is facilitated; in addition, a stress of film layer can be changed by adjusting a process condition of SiNx or a ratio of SiNx/SiO$_2$, so that the stress can be offset by a stress of the subsequent film layer, a stress accumulation is avoided, and the film layer is prevented from being broken due to spontaneous curling caused by overlarge stress after the flexible device is stripped off.

It should be noted that different technical features in the above embodiment may be combined with each other, and the technical solution of fingerprint identifying module obtained by combining the technical features also belongs to the protection scope of the present disclosure.

Figure 12:
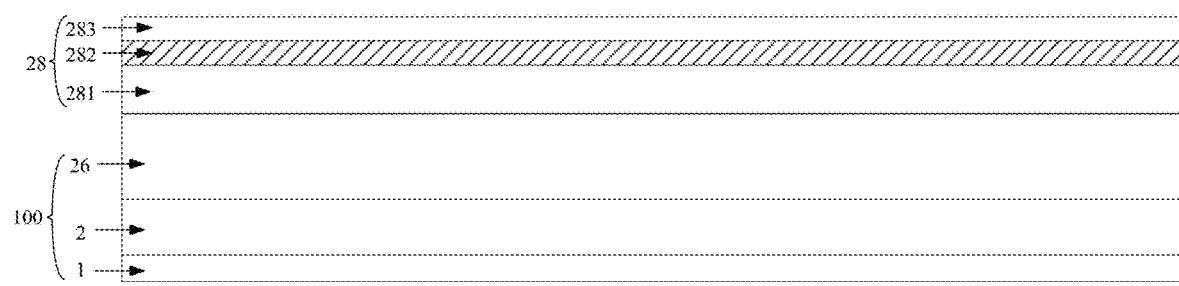
FIG. 12 is a schematic structural diagram of a display device according to an embodiment of the present disclosure.

Based on a same inventive concept, an embodiment of the present disclosure further provides a display device. FIG. 12 is a schematic structural diagram of a display device according to an embodiment of the present disclosure, and as shown in FIG. 12, the display device includes a fingerprint identification module and a display panel 28, where the fingerprint identification module may be any fingerprint identification module 100 provided in the above embodiment, and the display panel 28 is located on a side of the first light blocking pattern 3 away from the substrate 1.

In some implementations, the display panel 28 may be an Organic Light Emitting Diode (OLED) display panel 28, a Quantum Dot Light Emitting Diode (QLED) display panel 28, or the like, and the embodiment of the present disclosure is not limited thereto. The OLED display panel 28 may be, for example, a flexible OLED display panel 28. For example, the OLED display panel 28 and the QLED display panel 28 have self-luminous characteristics, and light emission of display pixel units thereof can be controlled or modulated as required, so as to facilitate fingerprint collection and contribute to improving an integration degree of the device.

The OLED display panel 28 generally includes a flexible OLED display back plate 281, a polarizer 282, and a protective cover plate 283, which are sequentially stacked in a direction away from the fingerprint identification module 100, where a material of the protective cover plate 283 may be polyimide (PI). A substrate of the flexible OLED display back plate 281 is a flexible substrate, and a specific material of the substrate may be PI or other flexible materials.

In some implementations, the display panel 28 is attached and fixed to the fingerprint identification module 100 by optical adhesive. In some implementations, the display panel 28 is spaced apart from the fingerprint identification module 100. The details will be described later with reference to specific cases.

Figure 13:
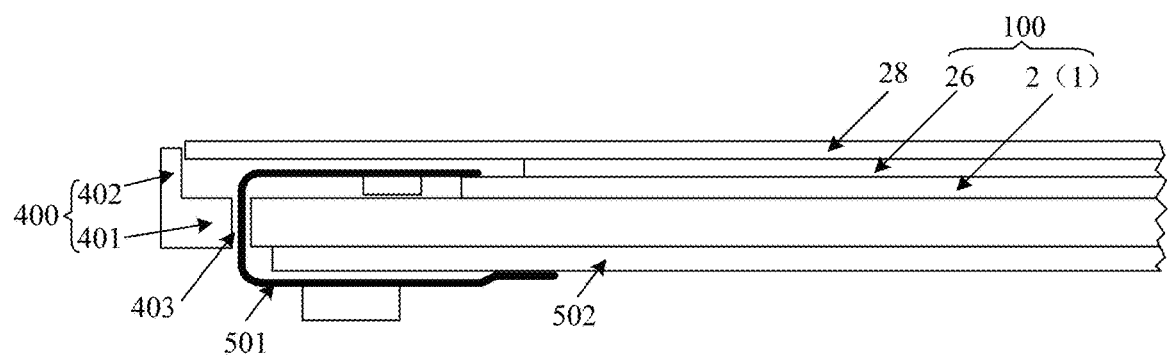
FIG. 13 is a schematic structural diagram of a display device according to an embodiment of the present disclosure.

FIG. 13 is a schematic structural diagram of a display device according to an embodiment of the present disclosure, and as shown in FIG. 13, in some implementations, the display device further includes a middle frame 400, the middle frame 400 include a bottom plate 401 and a side wall 402 formed by bending an edge of the bottom plate 401 towards a front side, the bottom plate 401 and the side wall 402 form an accommodating groove, and the fingerprint identification module 100 and the display panel 28 are fixed in the accommodating groove, and the display panel 28 is located a side of the fingerprint identification module 100 away from the bottom plate 401.

Referring to FIG. 13, the fingerprint identification module 100 is fixed on the bottom plate 401, and the display panel 28 and the fingerprint identification module 100 are fixed by optical adhesive, so that the display panel 28, the fingerprint identification module 100, and the middle frame 400 are fixed together.

Figure 14:
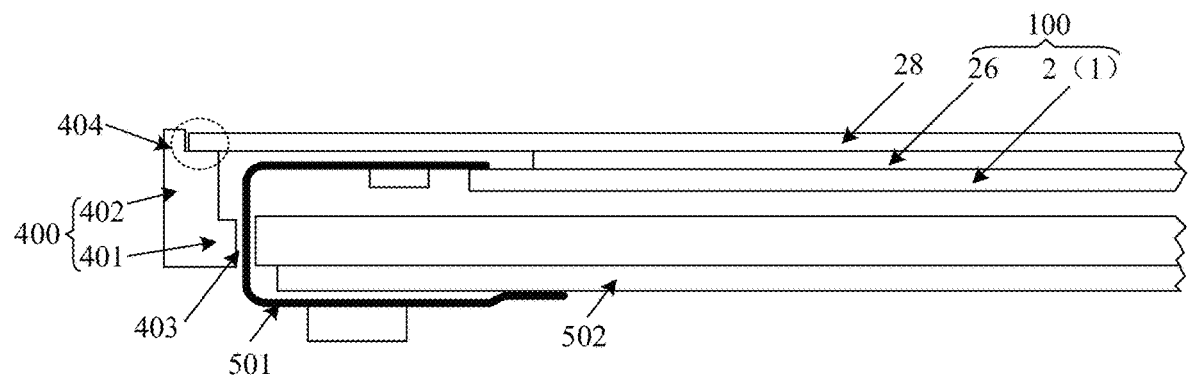
FIG. 14 is a schematic structural diagram of a display device according to an embodiment of the present disclosure.

FIG. 14 is a schematic structural view of a display device according to an embodiment of the present disclosure, and as shown in FIG. 14, different from the case shown in FIG. 13, in the case shown in FIG. 14, the display panel 28 and the fingerprint identification module 100 are fixed by optical adhesive, a step-shaped support structure 404 is formed on the side wall 402, and the display panel 28 is fixed on the step-shaped support structure 404, which can also realize that the display panel 28, the fingerprint identification module 100, and the middle frame 400 are fixed together.

Figure 15:
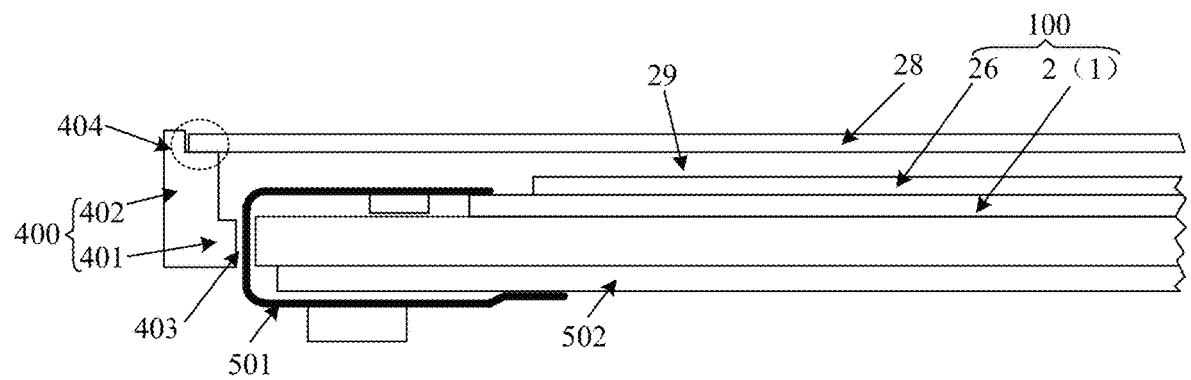
FIG. 15 is a schematic structural diagram of a display device according to an embodiment of the present disclosure.

FIG. 15 is a schematic structural view of a display device according to an embodiment of the present disclosure, and as shown in FIG. 15, unlike the cases shown in FIG. 13 and FIG. 14, in the case shown in FIG. 15, the display panel 28 and the fingerprint identifying module 100 are disposed at an interval, and an air spacer layer 29 is disposed between therebetween. In such case, the fingerprint identification module 100 is fixed on the bottom plate 401 and the display panel 28 is fixed on the step-shaped support structure 404.

In some implementations, a minimum spacing between the display panel 28 and the fingerprint identification module 100 is greater than or equal to 100 μm.

If the display panel 28 and the fingerprint identification module 100 are too close to each other, an electromagnetic coupling may be caused, which increases noise of the photoelectric sensor 20 in the fingerprint identification module 100, and finally results in a poor quality of image; furthermore, moire may be formed between pixel units for displaying in the display panel 28 and pixel units for fingerprint identification in the fingerprint identification module 100, which may affect subsequent image processing and fingerprint identification. In the embodiment of the present disclosure, by arranging the display panel 28 and the fingerprint identification module 100 at an interval, a distance between the display panel 28 and the fingerprint identification module 100 is increased, which can reduce coupling noise between the display panel 28 and the fingerprint identification module 100, avoid moire occurring, and is favorable to promoting a quality of image of the fingerprint.

Figure 16:
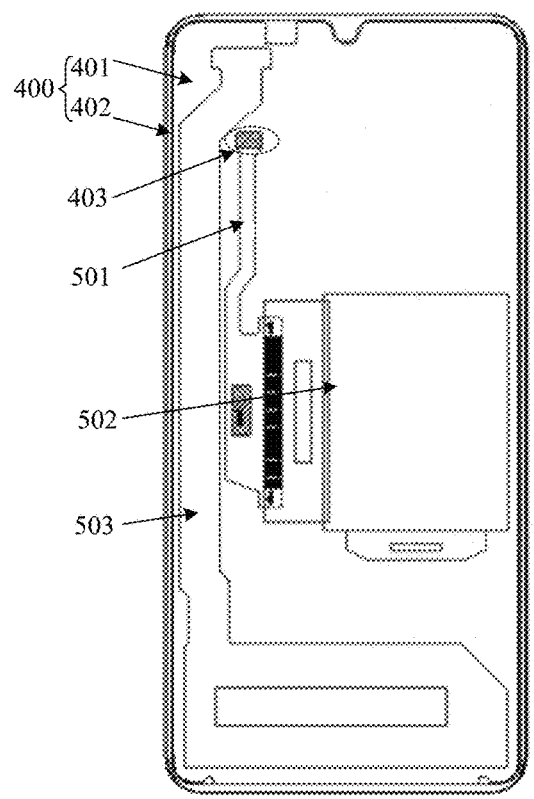
FIG. 16 is a schematic top view of a back side of a bottom plate shown in FIGS. 13 to 15.

FIG. 16 is a schematic top view of a back surface of the bottom plate shown in FIGS. 13 to 15, and as shown in FIG. 16, in some implementations, the bottom plate 401 is formed with a through hole 403 therein, and the display device further includes a flexible circuit board 501 for fingerprint identification and a chip 502 for fingerprint identification; the flexible circuit board 501 for fingerprint identification penetrates through the through hole 403, and an end of the flexible circuit board 501 is electrically coupled (generally, through a bonding process) to the bonding electrode located in the bonding region of the fingerprint identification module 100, and another end of the flexible circuit board 501 is electrically coupled (generally, through a die bonding process) to the chip 502 for fingerprint identification located on the back surface of the bottom plate 401. Similarly, a chip for displaying (not shown) and a flexible circuit board for displaying may be electrically coupled to the display panel 28 in the accommodating groove in the same manner as above.

Figure 17:
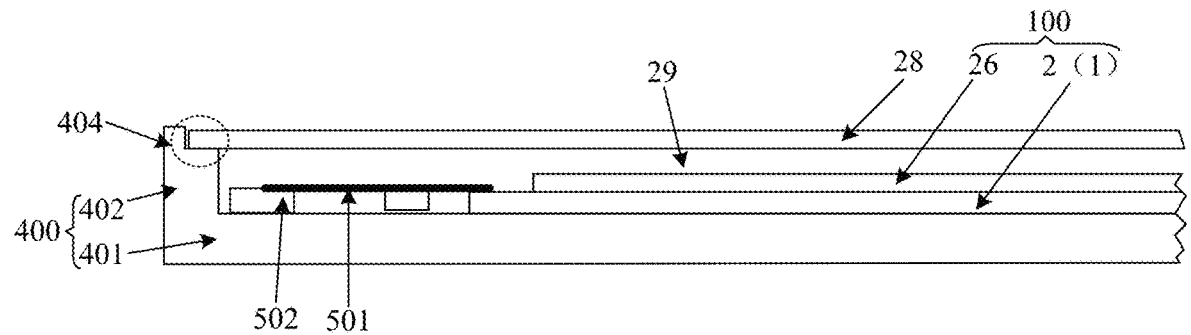
FIG. 17 is a schematic structural diagram of a display device according to an embodiment of the present disclosure.

FIG. 17 is a schematic structural diagram of a display device according to an embodiment of the present disclosure, and as shown in FIG. 17, different from the cases shown in FIG. 13 to FIG. 15, in the case shown in FIG. 17, an end of the flexible circuit board 501 for fingerprint identification is electrically coupled to the bonding electrode for fingerprint identification located in the peripheral area of the fingerprint identification module 100, another end of the flexible circuit board 501 for fingerprint identification is electrically coupled to the chip for fingerprint identification, and both the flexible circuit board 501 for fingerprint identification and the chip 502 for fingerprint identification are located in the accommodating groove.

In some implementations, the display panel 28 further includes functional layers such as an encapsulation layer and a touch layer, which may refer to related technologies and are not described herein.

The display device according to the embodiment of the present disclosure may be any product or component having a fingerprint identification function, such as a mobile phone, a tablet computer, a display, and a notebook computer, which is not specifically limited in the embodiment of the present disclosure.

Figure 18:
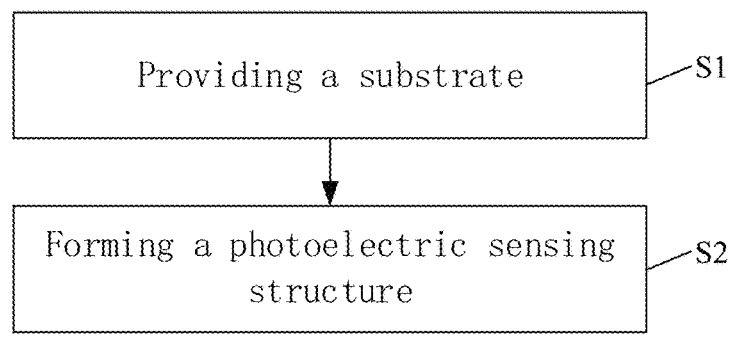
FIG. 18 is a flowchart of a method for manufacturing a fingerprint identification module according to an embodiment of the present disclosure.

Based on a same inventive concept, an embodiment of the present disclosure further provides a method for manufacturing a fingerprint identification module, which can be used for manufacturing the fingerprint identification module in the above embodiment. FIG. 18 is a flowchart of a method for manufacturing a fingerprint identification module according to an embodiment of the present disclosure, and as shown in FIG. 18, the method for manufacturing the fingerprint identification module includes following steps S1 and S2.

In step S1, a substrate is provided.

The substrate may be a glass substrate or a PI flexible substrate.

When the substrate is a flexible substrate, firstly, a glass substrate is cleaned and water vapor on surfaces thereof are dried to remove stains on the surfaces; then, liquid PI is coated on the glass substrate, or a PI film is directly hot-pressed on the glass substrate by silane coupling agent.

After the step S1 is finished and before the step S2 is started, a layer of SiNx or SiNx+SiO$_2$ with a certain thickness may be deposited on a clean PI surface to serve as a third insulating layer for preventing water and oxygen from penetrating from a back surface of the PI after being stripped off to damage film layers in the device, which facilitates the deposition of a subsequent film layer; in addition, a stress of film layer can be changed by adjusting a process condition of SiNx or a ratio of SiNx and SiO$_2$, so that the stress can be offset by a stress of the subsequent film layer, a stress accumulation is avoided, and the film layer is prevented from being broken due to spontaneous curling caused by overlarge stress after the flexible device is stripped off.

The substrate has a fingerprint identification area and a peripheral area located at a periphery of the fingerprint identification area, and the fingerprint identification area includes a photosensitive region.

In step S2, a photoelectric sensing structure is formed on the substrate.

The photoelectric sensing structure is located on the substrate and in the fingerprint identification area, and includes a plurality of gate lines, a plurality of signal sensing lines, and a plurality of pixel units defined by the plurality of gate lines and the plurality of signal sensing lines, where each pixel unit includes a thin film transistor, a gate electrode of the thin film transistor is electrically coupled to one of the gate lines corresponding thereto, and a first electrode of the thin film transistor is electrically coupled to one of the signal sensing lines corresponding thereto; the fingerprint identification area includes a photosensitive region, the pixel unit located in the photosensitive region further includes a photoelectric sensor, and the photoelectric sensor includes a third electrode, a photosensitive pattern and a fourth electrode which are sequentially stacked along a direction away from the substrate, and the third electrode is coupled to a second electrode of the thin film transistor located in the same pixel unit as that where the photoelectric sensor is located; an area ratio of the photoelectric sensor to the pixel unit corresponding thereto ranges from 40% to 90%.

In some implementations, after the photoelectric sensing structure is formed, a step of forming a bias wiring (first/second light blocking pattern), a collimating structure, an infrared filter layer, and other structures may be further included. The specific manufacturing processes of the photoelectric sensing structure, the bias wiring, the collimating structure, the infrared filter layer and other structures may refer to the corresponding contents in the foregoing embodiment, which will not be repeated here.

It should be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A fingerprint identification module, comprising:
   a substrate comprising a fingerprint identification area and a peripheral area located at a periphery of the fingerprint identification area;
   a photoelectric sensing structure located on the substrate and in the fingerprint identification area, and comprising a plurality of gate lines, a plurality of signal sensing lines and a plurality of pixel units defined by the plurality of gate lines and the plurality of signal sensing lines in a crossed manner, wherein each pixel unit comprises a thin film transistor, a gate electrode of the thin film transistor is electrically coupled to one of the gate lines corresponding thereto, and a first electrode of the thin film transistor is electrically coupled to one of the signal sensing lines corresponding thereto;
   wherein the fingerprint identification area comprises a photosensitive region, the pixel unit located in the photosensitive region further comprises a photoelectric sensor, and the photoelectric sensor comprises a third electrode, a photosensitive pattern and a fourth electrode which are sequentially stacked along a direction away from the substrate, and the third electrode is coupled to a second electrode of the thin film transistor located in the same pixel unit as that where the photoelectric sensor is located;
   an area ratio of the photoelectric sensor to the pixel unit corresponding thereto ranges from 40% to 90%,
   wherein a part of an active layer of the thin film transistor between the first electrode and the second electrode of the thin film transistor serves as a channel region of the thin film transistor, and the channel region of the thin film transistor is in an inverted L shape or an arc shape,
   the fingerprint identification area further comprises a dummy region located at a periphery of the photosensitive region, and the pixel unit in the dummy region is configured to output a reference noise signal to the signal sensing line corresponding thereto.

2. The fingerprint identification module of claim 1, wherein an orthographic projection of the photoelectric sensor on the substrate does not overlap with an orthographic projection of the active layer of the thin film transistor on the substrate.

3. The fingerprint identification module of claim 1, wherein the gate lines extend along a first direction, the signal sensing lines extend along a second direction, and the first direction is perpendicular to the second direction;
   the thin film transistor comprises the gate electrode, the active layer, the first electrode and the second electrode, a cross section of the first electrode parallel to a plane where the substrate is located is rectangular, the first electrode is provided with a first side edge and a second side edge which are oppositely arranged in the first direction and a third side edge and a fourth side edge which are oppositely arranged in the second direction, the first electrode is electrically coupled to the signal sensing line nearest to the first side edge of the first electrode, and the gate electrode is electrically coupled to the gate line nearest to the third side edge of the first electrode;
   the second electrode comprises a first conductive part and a second conductive part, the first conductive part extends along the first direction and is arranged opposite to the second side edge of the first electrode, the second conductive part extends along the second direction and is arranged opposite to the fourth side edge of the first electrode, and the first conductive part is electrically coupled to the second conductive part, wherein the second electrode further comprises a third conductive part, the first conductive part, the second conductive part and the third conductive part are arranged in a same layer, a direction in which the third conductive part extends is intersected with the first direction and the second direction, and two ends of the third conductive part are coupled to the first conductive part and the second conductive part respectively.

4. The fingerprint identifying module of claim 1, wherein a planarization layer and a passivation layer are sequentially disposed on a side of the photosensitive pattern away from the substrate, and the fourth electrode is disposed on a side of the passivation layer away from the substrate and electrically coupled to the photosensitive pattern corresponding thereto through via holes in the planarization layer and the passivation layer;

the pixel unit located in the dummy region further comprises a fifth electrode and a sixth electrode, the fifth electrode is electrically coupled to the second electrode of the thin film transistor in the dummy region, and the planarization layer and the passivation layer are arranged between the fifth electrode and the sixth electrode, the fingerprint identifying module further comprises a first light blocking pattern, and the first light blocking pattern is located on a side of the sixth electrode away from the substrate, and an orthographic projection of the first light blocking pattern on the substrate completely covers the dummy region and does not cover the photosensitive region.

5. The fingerprint identification module of claim 1, wherein a first insulating layer is formed on a side of the thin film transistor away from the substrate, and the photoelectric sensor in the photosensitive region is coupled to the second electrode of the thin film transistor through a via hole in the first insulating layer;

a planarization layer and a passivation layer are sequentially arranged on a side of the photosensitive pattern away from the substrate, and the fourth electrode is located on a side of the passivation layer away from the substrate, and is electrically coupled to the photosensitive pattern corresponding thereto through via holes in the planarization layer and the passivation layer;

the pixel unit located in the dummy region further comprises a fifth electrode and a sixth electrode, the fifth electrode is electrically coupled to the second electrode of the thin film transistor in the dummy region, the fifth electrode and the third electrode are arranged in a same layer and are made of a same material, the sixth electrode and the fourth electrode are arranged in a same layer and are made of a same material, and the first insulating layer, the planarization layer and the passivation layer are arranged between the fifth electrode and the sixth electrode, the fingerprint identifying module further comprises a first light blocking pattern, and the first light blocking pattern is located on a side of the sixth electrode away from the substrate, and an orthographic projection of the first light blocking pattern on the substrate completely covers the dummy region and does not cover the photosensitive region.

6. The fingerprint identification module of claim 1, wherein the pixel unit located in the dummy region further comprises a sensor contrast structure, the sensor contrast structure comprises a fifth electrode, a contrast pattern and a sixth electrode which are sequentially stacked along a direction away from the substrate, the fifth electrode is electrically coupled to the second electrode of the thin film transistor located in the dummy region, the fifth electrode and the third electrode are arranged in a same layer and made of a same material, and the sixth electrode and the fourth electrode are arranged in a same layer and made of a same material;

a material of the contrast pattern is a non-photoelectric material and a dielectric constant of the contrast pattern is approximately the same as that of the photosensitive pattern, the fingerprint identifying module further comprises a first light blocking pattern, and the first light blocking pattern is located on a side of the sixth electrode away from the substrate, and an orthographic projection of the first light blocking pattern on the substrate completely covers the dummy region and does not cover the photosensitive region.

7. The fingerprint identification module of claim 1, further comprising:

a collimating structure located on a side of the photoelectric sensing structure away from the substrate, and covers at least the photosensitive region;

the collimating structure comprises an aperture layer, and the aperture layer comprises a plurality of light-transmitting holes arranged in an array.

8. The fingerprint identification module of claim 7, wherein the collimating structure further comprises a medium light-transmitting layer, a lens layer and a flat light-transmitting layer which are located on a side of the aperture layer away from the substrate, and are sequentially stacked along a direction away from the substrate;

the lens layer comprises a plurality of convex lenses corresponding to the light-transmitting holes one to one, and an optical axis of each convex lens passes through the light-transmitting hole corresponding thereto, wherein the convex lenses are plano-convex lenses, a planar surface of each plano-convex lens faces the medium light-transmitting layer and is attached to a surface of the medium light-transmitting layer, and a convex surface of each plano-convex lens faces the flat light-transmitting layer and is attached to a surface of the flat light-transmitting layer.

9. The fingerprint identification module of claim 7, wherein each photoelectric sensor corresponds to multiple ones of the light-transmitting holes, and each light-transmitting hole corresponds to one photoelectric sensor, wherein the number of light-transmitting holes corresponding to each photoelectric sensor is the same;

the number of the light-transmitting holes corresponding to each photoelectric sensor ranges from 4 to 100.

10. The fingerprint identification module of claim 7, further comprising:

an invisible light filter layer located on a side of the photoelectric sensor away from the substrate, and configured to filter out invisible light in transmitted light, wherein the invisible light filter layer comprises an infrared filter layer configured to filter out infrared light in the transmitted light, or the infrared filter layer comprises an infrared absorbing layer having a function for absorbing infrared light or an infrared reflecting layer having a function for reflecting infrared light.

11. The fingerprint identification module of claim 10, wherein the invisible light filter layer is integrated within the collimating structure,
- wherein the invisible light filter layer is filled in the light-transmitting holes, or
- wherein the collimating structure comprises an aperture layer, a medium light-transmitting layer, a lens layer and a flat light-transmitting layer which are sequentially stacked along a direction away from the substrate, the lens layer comprises a plurality of convex lenses corresponding to the light-transmitting holes one to one, and an optical axis of each convex lens passes through the light-transmitting hole corresponding thereto; and
- at least one of the medium light-transmitting layer and the flat light-transmitting layer is multiplexed as the invisible light filter layer.

12. The fingerprint identification module of claim 1, wherein the photoelectric sensing structure comprises a gate electrode, a gate insulating layer, an active layer, a first conductive electrode layer, a first insulating layer, a photosensitive pattern, a planarization layer, a passivation layer and a second conductive electrode layer which are sequentially stacked along a direction away from the substrate, and a first light blocking pattern is located on a side of the second conductive electrode layer away from the substrate;
- the first conductive electrode layer comprises the first electrode, the second electrode and the third electrode, and the second conductive electrode layer comprises the fourth electrode.

13. The fingerprint identification module of claim 12, wherein a second insulating layer is disposed on a side of the fourth electrode away from the substrate, a bias wiring is disposed on a side of the second insulating layer away from the substrate and in the peripheral area, and the fourth electrode extends to the peripheral area and is electrically coupled to the bias wiring through a via hole in the second insulating layer.

14. The fingerprint identification module of claim 13, wherein a material of the bias wiring comprises a metal material, and the first light blocking pattern and the bias wiring are disposed in a same layer and made of a same material, wherein
the fingerprint identification module further comprises:
- a second light blocking pattern, and the second light blocking pattern and the bias wiring are arranged in a same layer and made of a same material;
- an orthographic projection of the second light blocking pattern on the substrate completely covers an orthographic projection of the channel region of the active layer in the thin film transistor on the substrate, the fingerprint identification module further comprises:
- a barrier layer located on a side of the second light blocking pattern away from the substrate, and a ground shielding layer located on a side of the barrier layer away from the substrate, and an orthographic projection of the ground shielding layer on the substrate completely covers the fingerprint identification area, and
- wherein the ground shielding layer is electrically coupled to the first light blocking pattern and the second light blocking pattern through via holes in the barrier layer.

15. The fingerprint identification module of claim 1, wherein the substrate is a flexible substrate, and a third insulating layer is disposed between the substrate and the photoelectric sensing structure.

16. A display device, comprising: the fingerprint identification module of claim 1 and a display panel,
- wherein the fingerprint identification module comprises a first light blocking pattern disposed on a side of the photoelectric sensor away from the substrate, and the display panel is disposed on a side of the first light blocking pattern away from the substrate.

17. The display device of claim 16, wherein the display panel is fixed to the fingerprint identification module by optical adhesive;
- or, the display panel and the fingerprint identification module are arranged with an interval therebetween.

18. The display device of claim 16, further comprising:
- a middle frame comprising a bottom plate and a side wall formed by bending an edge of the bottom plate towards a front side, the bottom plate and the side wall form an accommodating groove, the fingerprint identification module and the display panel are fixed in the accommodating groove, and the display panel is located on a side of the fingerprint identification module away from the bottom plate,
- wherein the fingerprint identification module is fixed to the bottom plate, and/or
- the side wall has a step-shaped support structure formed thereon, to which the display panel is fixed.

19. The display device of claim 18, further comprising a flexible circuit board for fingerprint identification and a chip for fingerprint identification, an end of the flexible circuit board is electrically coupled to a bonding electrode for fingerprint identification located in the peripheral area of the fingerprint identification module, and another end of the flexible circuit board is electrically coupled to the chip for fingerprint identification,
- wherein a through hole is formed in the bottom plate, the flexible circuit board for fingerprint identification penetrates through the through hole, and the chip for fingerprint identification is located on a back side of the bottom plate, or
- the flexible circuit board for fingerprint identification and the chip for fingerprint identification are both located in the accommodating groove.

* * * * *